US011257931B2

(12) United States Patent
Chang et al.

(10) Patent No.: US 11,257,931 B2
(45) Date of Patent: *Feb. 22, 2022

(54) GATE STRUCTURE OF FIELD EFFECT TRANSISTOR WITH FOOTING

(71) Applicant: TAIWAN SEMICONDUCTOR MANUFACTURING COMPANY LTD., Hsinchu (TW)

(72) Inventors: Che-Cheng Chang, New Taipei (TW); Chang-Yin Chen, Taipei (TW); Jr-Jung Lin, Hsinchu (TW); Chih-Han Lin, Hsinchu (TW); Yung Jung Chang, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/740,252

(22) Filed: Jan. 10, 2020

(65) Prior Publication Data

US 2020/0152774 A1    May 14, 2020

Related U.S. Application Data

(60) Continuation of application No. 16/430,834, filed on Jun. 4, 2019, now Pat. No. 10,535,758, which is a
(Continued)

(51) Int. Cl.
*H01L 29/66* (2006.01)
*H01L 21/265* (2006.01)
(Continued)

(52) U.S. Cl.
CPC .. *H01L 29/66795* (2013.01); *H01L 21/26586* (2013.01); *H01L 21/32133* (2013.01);
(Continued)

(58) Field of Classification Search
CPC ............ H01L 29/165; H01L 29/66795; H01L 29/7848; H01L 29/785
See application file for complete search history.

(56) References Cited

U.S. PATENT DOCUMENTS 9,620,621 B2 * 4/2017 Chang ................. H01L 29/0649
10,535,758 B2 * 1/2020 Chang ................. H01L 29/6656
(Continued)

OTHER PUBLICATIONS

Sze and Ng, "Physics of Semiconductor Devices ," John Wiley and Sons, Third Edition, pp. 340-345. (Year: 2007).*

*Primary Examiner* — Michael Carter
(74) *Attorney, Agent, or Firm* — WPAT, P.C., Intellectual Property Attorneys; Anthony King

(57) ABSTRACT

In some embodiments, a field effect transistor structure includes a first semiconductor structure and a gate structure. The first semiconductor structure includes a channel region, and a source region and a drain region. The source region and the drain region are formed on opposite ends of the channel region, respectively. The gate structure includes a central region and footing regions. The central region is formed over the first semiconductor structure. The footing regions are formed on opposite sides of the central region and along where the central region is adjacent to the first semiconductor structure.

20 Claims, 25 Drawing Sheets

Related U.S. Application Data continuation of application No. 16/102,502, filed on Aug. 13, 2018, now Pat. No. 10,312,352, which is a continuation of application No. 15/430,901, filed on Feb. 13, 2017, now Pat. No. 10,050,128, which is a division of application No. 14/180,895, filed on Feb. 14, 2014, now Pat. No. 9,620,621.

(51) Int. Cl.
| | | |
|---|---|---|
| *H01L 29/165* | (2006.01) | |
| *H01L 29/78* | (2006.01) | |
| *H01L 21/3213* | (2006.01) | |
| *H01L 29/06* | (2006.01) | |
| *H01L 29/08* | (2006.01) | |

(52) U.S. Cl.
CPC ...... *H01L 29/0649* (2013.01); *H01L 29/0847* (2013.01); *H01L 29/165* (2013.01); *H01L 29/6656* (2013.01); *H01L 29/66545* (2013.01); *H01L 29/66636* (2013.01); *H01L 29/785* (2013.01); *H01L 29/7848* (2013.01)

(56) References Cited

U.S. PATENT DOCUMENTS

2007/0020777 A1* 1/2007 Tso .................. H01L 22/26
  438/14
2008/0265321 A1* 10/2008 Yu .................. H01L 29/66795
  257/344
2012/0018848 A1* 1/2012 Huang ............... H01L 21/2236
  257/616

* cited by examiner

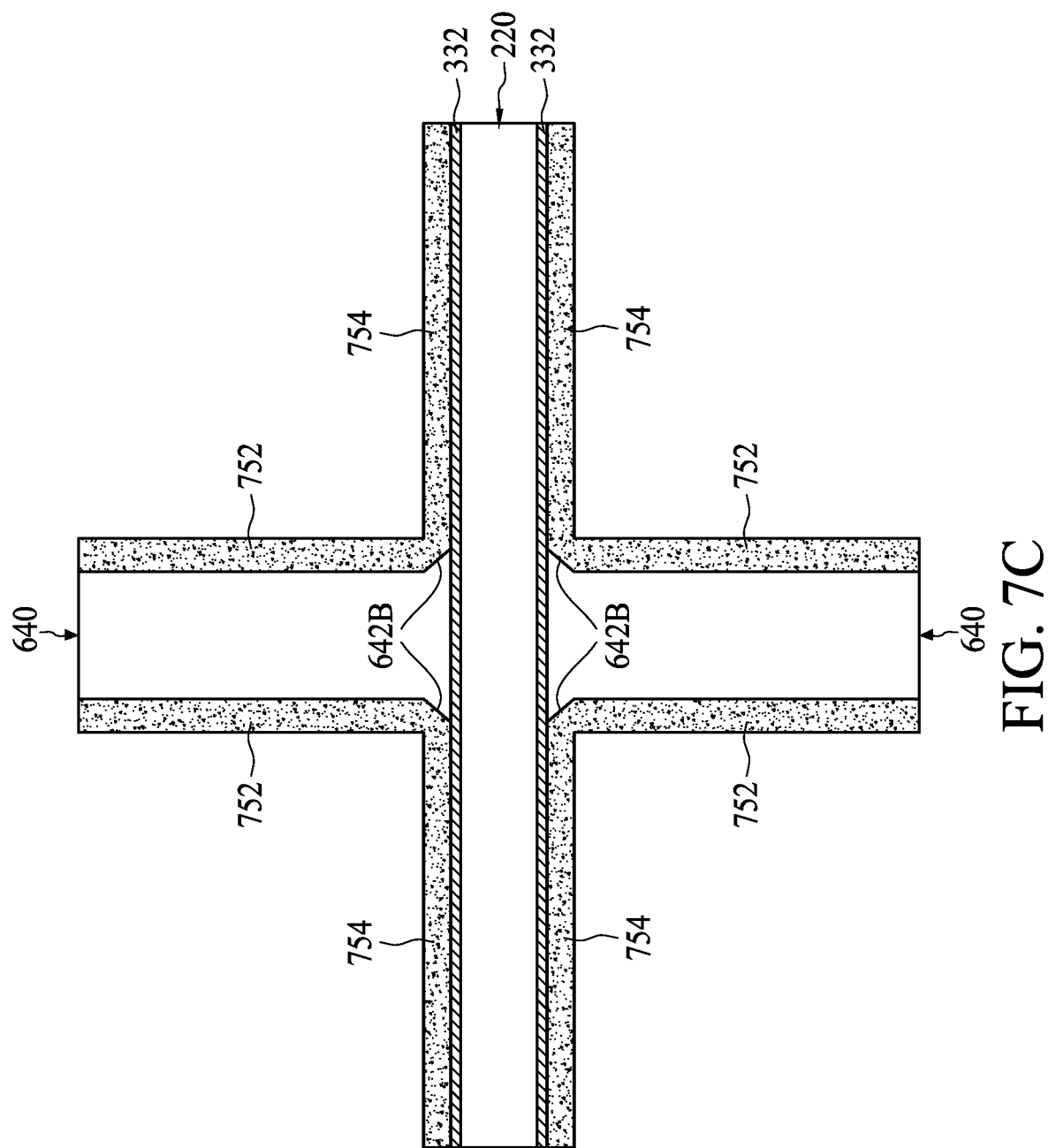

GATE STRUCTURE OF FIELD EFFECT TRANSISTOR WITH FOOTING

CROSS-REFERENCE TO RELATED APPLICATIONS

This application is a continuation application of U.S. application Ser. No. 16/430,834, filed on Jun. 4, 2019, which is a continuation application of U.S. application Ser. No. 16/102,502, filed on Aug. 13, 2018, which is a continuation application of U.S. application Ser. No. 15/430,901, filed on Feb. 13, 2017, which is a divisional application of U.S. application Ser. No. 14/180,895, filed Feb. 14, 2014, and claims priority thereto.

BACKGROUND

Transistor scaling has provided ever-increasing transistor performance and density for the past few decades. For example, scaling of a gate length of a transistor, also known as a channel length of a planar transistor, not only decreases a size of the transistor, but also enhances its on-state current. However, with the decrease of the channel length, short channel effects (SCEs) that significantly increases an off-state current of the transistor become a bottle neck for advancement of scaling of the channel length.

Other techniques, such as applying mechanical strain to the channel region are considered to further the progress of performance enhancement. For example, lattice mismatch between the channel region and embedded source and drain regions causes uniaxial strain applied to the channel region, thereby improving carrier mobility of the channel region. Recently, non-planar transistors such as FinFET are shown to be promising in reducing the off-state current by limiting a body thickness of the transistor, thereby breaking through the bottle neck that hinders the scaling roadmap. Planar transistors formed using an ultra thin body semiconductor on insulator (UTB SOI) substrate are also shown to be a viable option.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 13 are schematic diagrams illustrating semiconductor structures formed by each operation of a method for forming the FinFET structure 10 in FIGS. 1A to 1C in accordance with some embodiments, wherein FIGS. 2 to 6, 7A, 8A, and 9 to 13 are perspective diagrams and FIGS. 7B and 7C, and FIGS. 8B and 8C are cross-sectional diagrams along line A-A' and line B-B' in FIG. 7A and FIG. 8A, respectively.

FIGS. 14A to 16 are schematic diagrams illustrating semiconductor structures formed by operations after the formation of the sacrificial gate structure in FIG. 6 in accordance with other embodiments, wherein FIGS. 14A, 15 and 16 are perspective diagrams

DETAILED DESCRIPTION

Figure 1A:
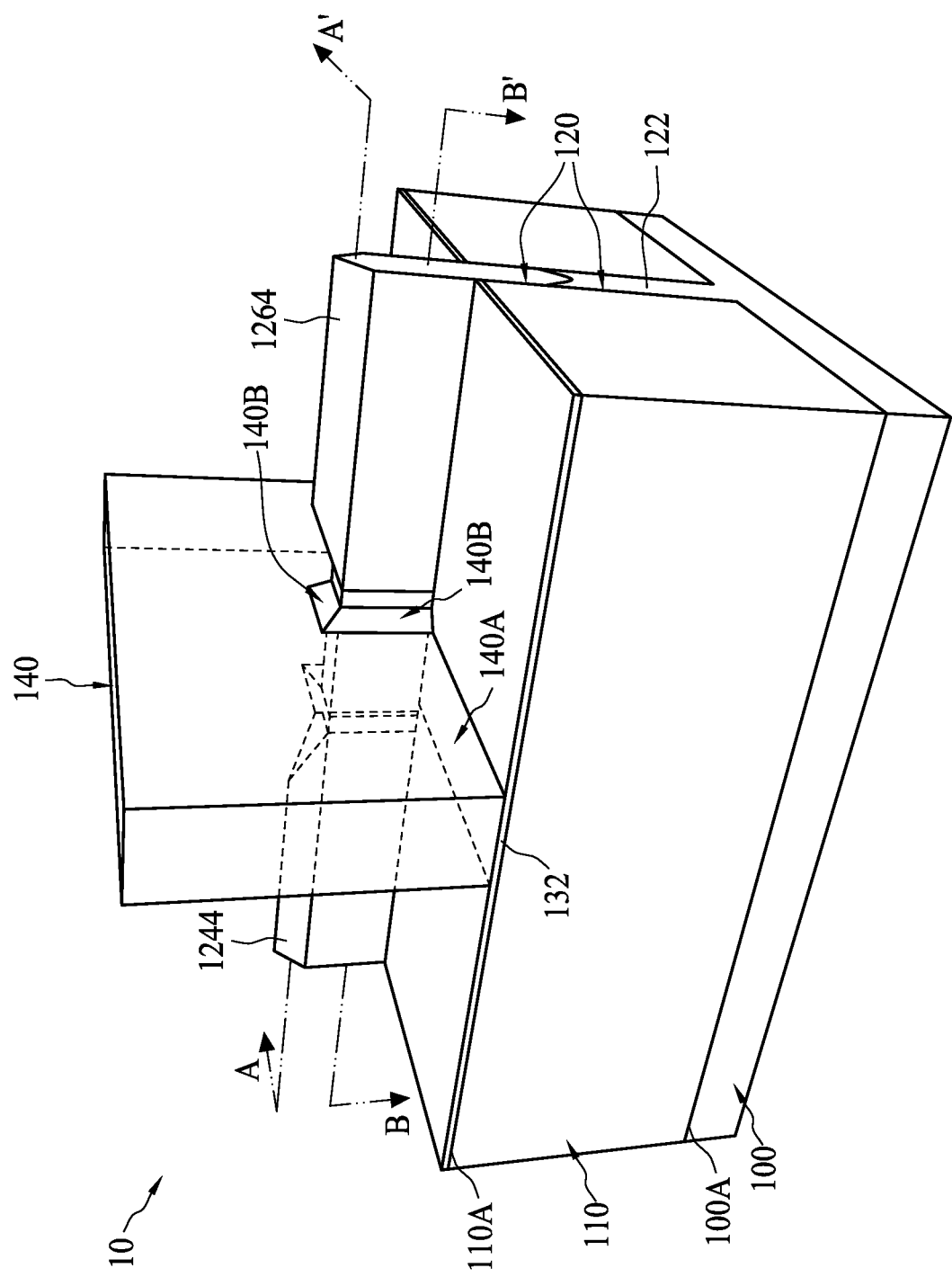
FIG. 1A is a schematic perspective diagram of a FinFET structure 10 with a gate structure 140 that includes footing regions 140B in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "under", "top", "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when a feature is "formed over" another feature or a substrate, intervening features may be present.

Figure 1B:
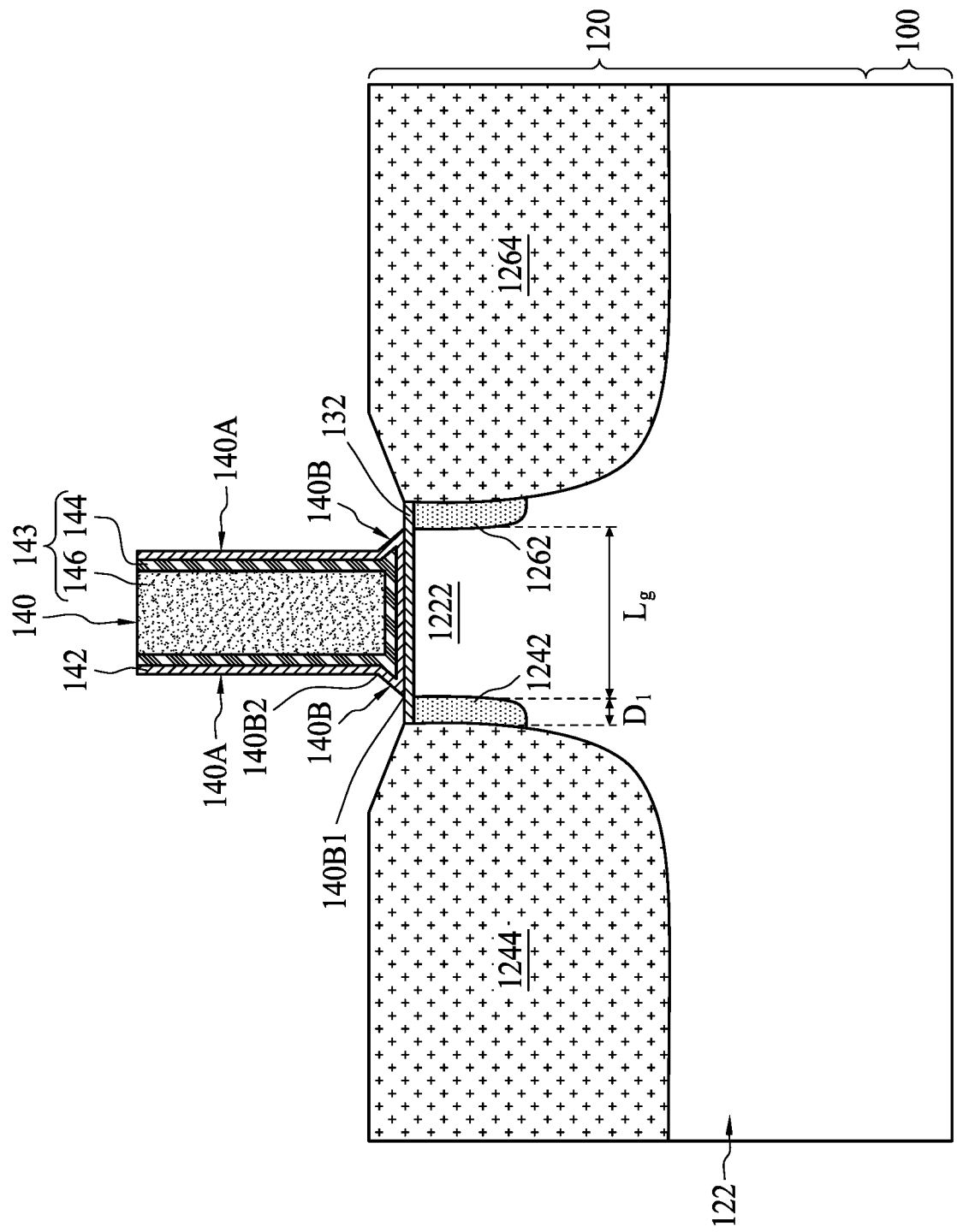
FIGS. 1B and 1C are a cross sectional diagram along line A-A' and line B-B' in FIG. 1A, respectively, in accordance with some embodiments.
Figure 1C:
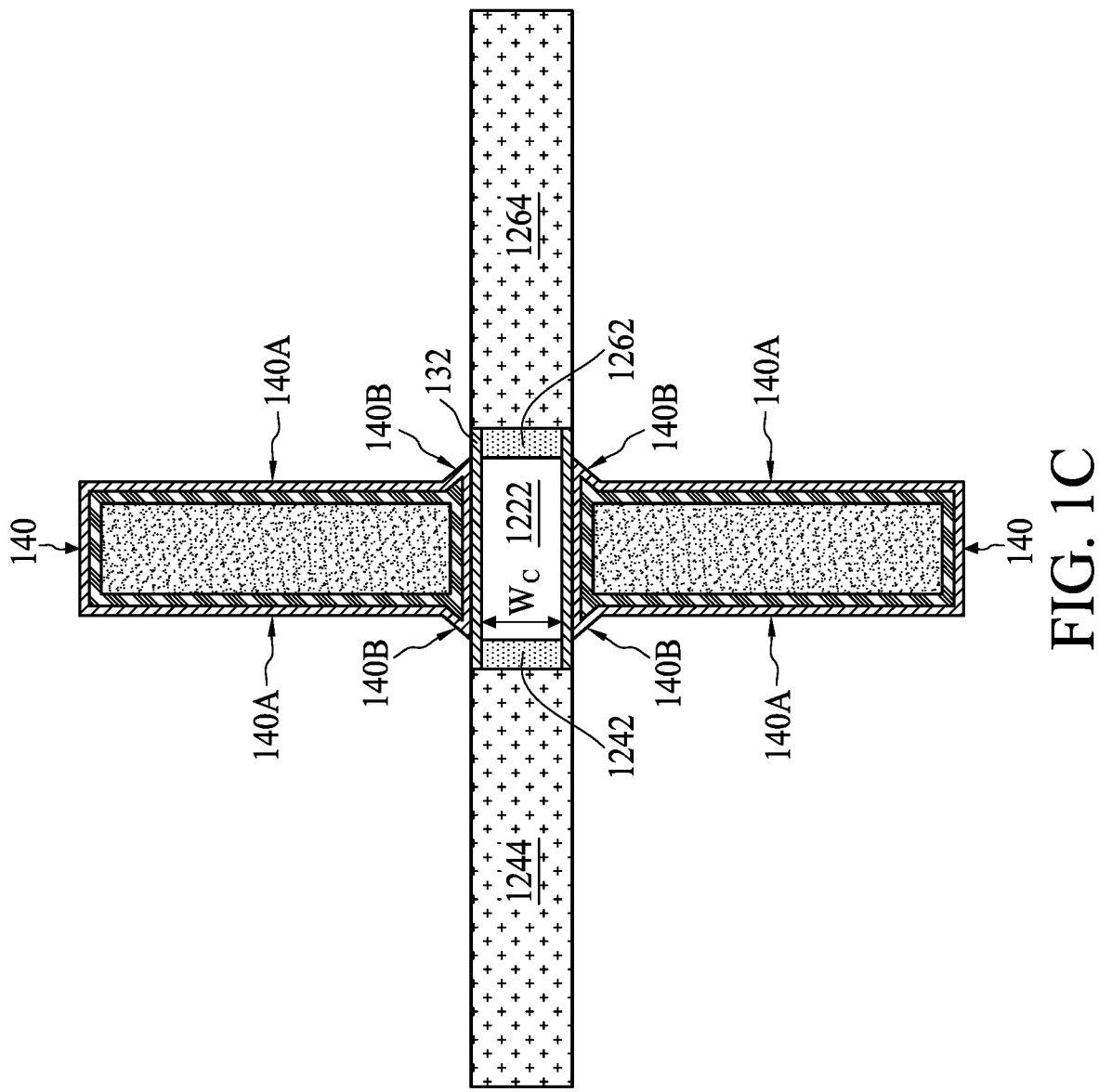

FIG. 1A is a schematic perspective diagram of a FinFET structure 10 with a gate structure 140 that includes footing regions 140B in accordance with some embodiments. FIGS. 1B and 1C are a cross sectional diagram along line A-A' and line B-B' in FIG. 1A, respectively, in accordance with some embodiments. FIG. 1A illustrates that the gate structure 140 includes a central region 140A, and footing regions 140B which are formed on opposite sides of the central region 140A and along where the central region 140A is adjacent to a fin-like semiconductor structure 120. FIGS. 1B and 1C illustrate the footing regions 140 that is adjacent to the top side of the channel region 122, and the footing regions that are adjacent to lateral sides of the channel region 122, respectively. Referring to FIG. 1A, the FinFET structure 10 includes a substrate 100, the fin-like semiconductor structure 120, dielectric isolation regions 110, an interfacial layer 132 and a gate structure 140.

In some embodiments, the substrate 100 is a bulk semiconductor substrate formed of an elementary material such as silicon in a crystalline structure. In other embodiments, the substrate 100 is formed of a compound material such as gallium arsenide, or an alloy material such as silicon germanium. The substrate 800 formed with other elementary semiconductor materials, compound semiconductor materials or alloy semiconductor materials are within the contemplated scope of the present disclosure. In some embodiments, an SOI substrate is used instead of the bulk semiconductor substrate. In some embodiments, the substrate 100 has a top surface 100A (labeled at the level of the top surface) on which the dielectric isolation regions 110 and the fin-like semiconductor structure 120 are formed.

In some embodiments, the dielectric isolation regions 110 such as shallow trench isolations (STIs) are formed on the top surface 100A of the substrate 100 and surround the fin-like semiconductor structure 120. The dielectric isolation regions 110 have top surfaces 110A (labeled at the level of the top surface). In some embodiments, the dielectric isolation regions 110 includes silicon oxide, silicon nitride, silicon oxy-nitride, fluoride-doped silicate (FSG), and/or a suitable low-k dielectric material.

In some embodiments, the fin-like semiconductor structure 120 protrudes from the top surface 100A of the substrate 100, and a portion of the fin-like semiconductor structure 120 extends beyond the top surfaces 110A of the dielectric isolation regions 110. The fin-like semiconductor structure 120 includes a body region 122 (shown in FIGS. 1A and 1B), embedded source and drain regions 1244 and 1264 (shown in FIGS. 1A, 1B and 1C), and source and drain extensions 1242 and 1262 (shown in FIG. 1B).

The body region 122 includes a channel region 1222 (shown in FIGS. 1B and 1C) formed above the top surfaces 110A (shown in FIG. 1A) of the dielectric isolation regions 110. A top side (shown in FIG. 1B), and two lateral sides (shown in FIG. 1C) of the channel region 1222 are wrapped around by the interfacial layer 132 and the gate structure 140. The two lateral sides of the channel region 1222 are formed across a width $W_c$ (shown in FIG. 1C) of the channel region 1222. The embedded source and drain regions 1244 and 1264 are formed on opposite ends of the channel region 1222 across a gate length $L_g$ (shown in FIG. 1B), respectively. In some embodiments, the embedded source and drain regions 1244 and 1264 are raised beyond the channel region 1222. The source and drain extensions 1242 and 1262 are formed between the channel region 1222, and the source and drain regions 1244 and 1264, respectively.

In some embodiments, the body region 122 is formed of silicon, other suitable elementary semiconductor, compound semiconductor, or alloy semiconductor similar to the substrate 100. In other embodiments, the body region 122 and the substrate 100 include multiple layers such that lattice mismatch between the channel region 1222 and a stressor layer (not illustrated) above or below the channel region 1222 causes the channel region 1222 to be biaxially strained by the stressor layer. In some embodiments, the embedded source and drain regions 1244 and 1264 are formed of a stressor material such that lattice mismatch between the channel region 1222 and the embedded source and drain regions 1244 and 1264 causes uniaxial strain applied to the channel region 1222. In some embodiments, for a p-type FET, the channel region 1222 is formed of silicon and the stressor material is a silicon germanium alloy. In this way, a lattice constant of the embedded source and drain regions 1244 and 1264 is larger than that of the channel region 1222, thereby inducing compressive strain that enhances hole mobility in the channel region 1222. In some embodiments, for an n-type FET, the channel region 1222 is formed of silicon and the stressor material is a silicon carbide alloy. In this way, a lattice constant of the embedded source and drain regions 1244 and 1264 are smaller than that of the channel region 1222, thereby inducing tensile strain which enhances electron mobility in the channel region 1222. In some embodiments, for the p-type FET, the embedded source and drain regions 1244 and 1264 are doped with p-type dopants such as boron, and for the n-type FET the embedded source and drain regions 1244 and 1264 are doped with n-type dopants such as phosphorus (P) or arsenic (As). The source and drain extensions 1242 and 1262 are lightly doped source/drain (LDD) regions which are more lightly doped than the source and drain regions 1244 and 1264.

In the embodiments described with references to FIGS. 1A to 1C, the FinFET structure 10 has the symmetric source and drain regions 1244 and 1264 and symmetric source and drain extensions 1242 and 1262. A FinFET structure with asymmetric source and drain regions and/or asymmetric source and drain extensions are within the contemplated scope of the present disclosure. Also, source and drain regions formed of the same material as the channel region are within the contemplated scope of the present disclosure.

In some embodiments, the interfacial layer 132 is formed on the top surfaces 100A of the dielectric isolation regions 110 shown in FIG. 1A, and wraps around a portion of the fin-like semiconductor structure 120 that includes the channel region 1222 shown in FIGS. 1B and 1C. In some embodiments, the interfacial layer 132 is formed of HfO, TiN, $SiO_2$, $Si_3N_4$, SiON, or combinations thereof.

Referring to FIG. 1A, in some embodiments, the gate structure 140 is formed on the interfacial layer 132 and traverses the width $W_c$ (shown in FIG. 1C) of the fin-like semiconductor structure 120. In some embodiments, the gate structure 140 includes a central region 140A and footing regions 140B. Referring to FIGS. 1A, 1B and 1C, the central region 140A straddles the fin-like semiconductor structure 120, and wraps around the interfacial layer 132 conformally formed on the three sides of the channel region 1222 of the fin-like semiconductor structure 120. The footing regions 140B are formed on opposite sides of the central region 140A and along where the central region 140A is adjacent to the channel region 1222. The opposite sides of the central region 140A are formed across the gate length $L_g$ shown in FIG. 1B. In some embodiments, each footing region 140B is tapered towards the central region 140A from one end 140B1 of the footing region 140B closer to the fin-like semiconductor structure 120 to one end 140B2 of the footing region 140B farther from the fin-like semiconductor structure 120. In some embodiments, the footing region 140B has a sloped profile. In some embodiments, the gate structure 140 includes a gate dielectric 142 and a gate electrode 143. The gate dielectric 142 includes one or more layers conformally formed on the interfacial layer 132. In some embodiments, the interfacial layer is used to form a good interface between the channel region 1222 and the gate dielectric 142 to suppress mobility degradation. In some embodiments, the gate dielectric is further conformally formed on side walls of the gate structure 140. Exemplary materials for the gate dielectric 142 include one or more high-k dielectric materials such as $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, and combinations thereof. The gate electrode 143 includes one or more work function metal layers 144 conformally formed on the gate dielectric 142 for adjusting a work function of the gate electrode 143, and a fill metal 146 that fills the remaining space of the gate structure 140 for serving as the main conductive portion of the gate electrode 143. Exemplary materials for the one or more work function metal layers 144 include TaC, TaN, TiN, TaAlN, TaSiN, and combinations thereof. Exemplary materials for the fill metal include W, Al, Cu, and combinations thereof.

The layers in the gate structure 140 are exemplary. The gate structure 132 with, for example, other layers, other surface coverage of the layers, other numbers of the layers are within the contemplated scope of the present disclosure.

In some of the embodiments described above, the gate structure 140 includes the footing regions 140B each of which tapers towards the central region 140A from the end 140B1 of the footing region 140B closer to the fin-like semiconductor structure 120 to the end 140B2 of the footing region 140B farther from the fin-like semiconductor structure 120. During ion implantation for forming, for example, the source and drain extensions 1242 and 1262, the interfacial layer 132 is protected by the tapered profile of the footing region 140B from being damaged, as will be described in more detail with references to FIGS. 8A to 8C. In brief, along the top side and lateral sides of the channel region 1222, the interfacial layer 132 is protected a sacrificial gate electrode in the footing regions 140B. The protected interfacial layer 132 facilitates more uniform deposition of the gate dielectric 142 shown in FIGS. 1B and 1C, thereby reducing a within gate work function variation that affects, for example, a threshold voltage of the device. Furthermore, referring to FIG. 1B, the channel region 1222 wrapped around by the gate structure 140 with footing regions 140B is larger than that of a channel region wrapped around by a gate structure without the footing regions. Hence, a distance $D_1$ between the channel region 1222 and the embedded source or drain region 1244 or 1264 is decreased, thereby increasing the mechanical strain applied to the channel region 1222 and enhancing a carrier mobility of the channel region 1222.

In the foregoing embodiments, the gate structure 140 and the interfacial layer 132 wrap around the three sides of the channel region 1222. Other types of the non-planar FET structures such as a gate-all-round FET structure with a gate structure and an interfacial layer that wrap all around the channel region 1222 are within the contemplated scope of the present disclosure.

Figure 2:
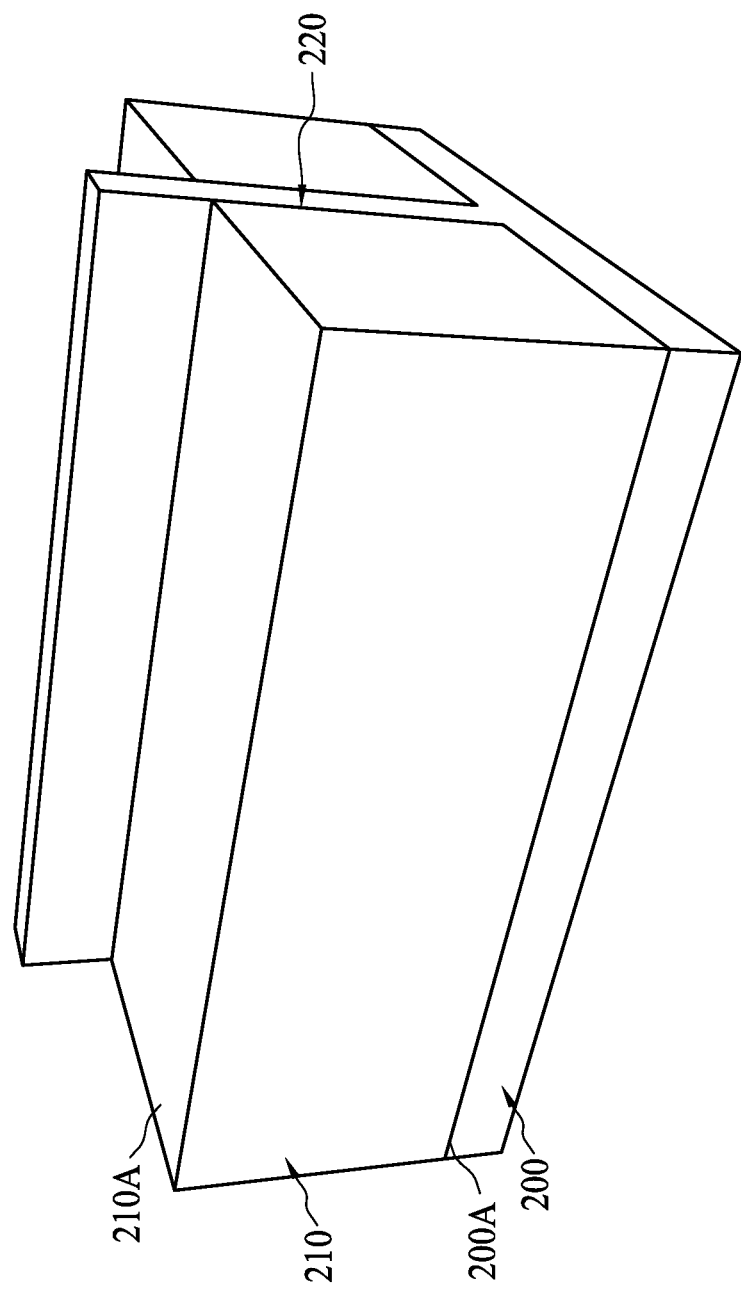

FIGS. 2 to 13 are schematic diagrams illustrating semiconductor structures formed by each operation of a method for forming the FinFET structure 10 in FIGS. 1A to 1C in accordance with some embodiments. FIGS. 2 to 6, 7A, 8A, and 9 to 13 are perspective diagrams and FIGS. 7B, 7C, 8B and 8C are cross-sectional diagrams. Referring to FIG. 2, a fin structure 220 protruding from a top surface 200A of a substrate 200 is formed. In some embodiments, the fin structure 220 is formed by etching trenches in a bulk semiconductor substrate. The top surface 200A of the substrate 200 is located at a level of the bottom surfaces of the trenches. Between the trenches is the fin structure 220 extending from the top surface 200A of the substrate 200. Further, the trenches are filled with a dielectric material to form the dielectric isolation regions 210. Exemplary dielectric materials have been provided with references to FIGS. 1A to 1C. In some embodiments, the dielectric isolation regions 210 are further etched so that a portion of the fin structure 220 beyond top surfaces 210A of the dielectric isolation regions 210 is exposed.

Figure 3:
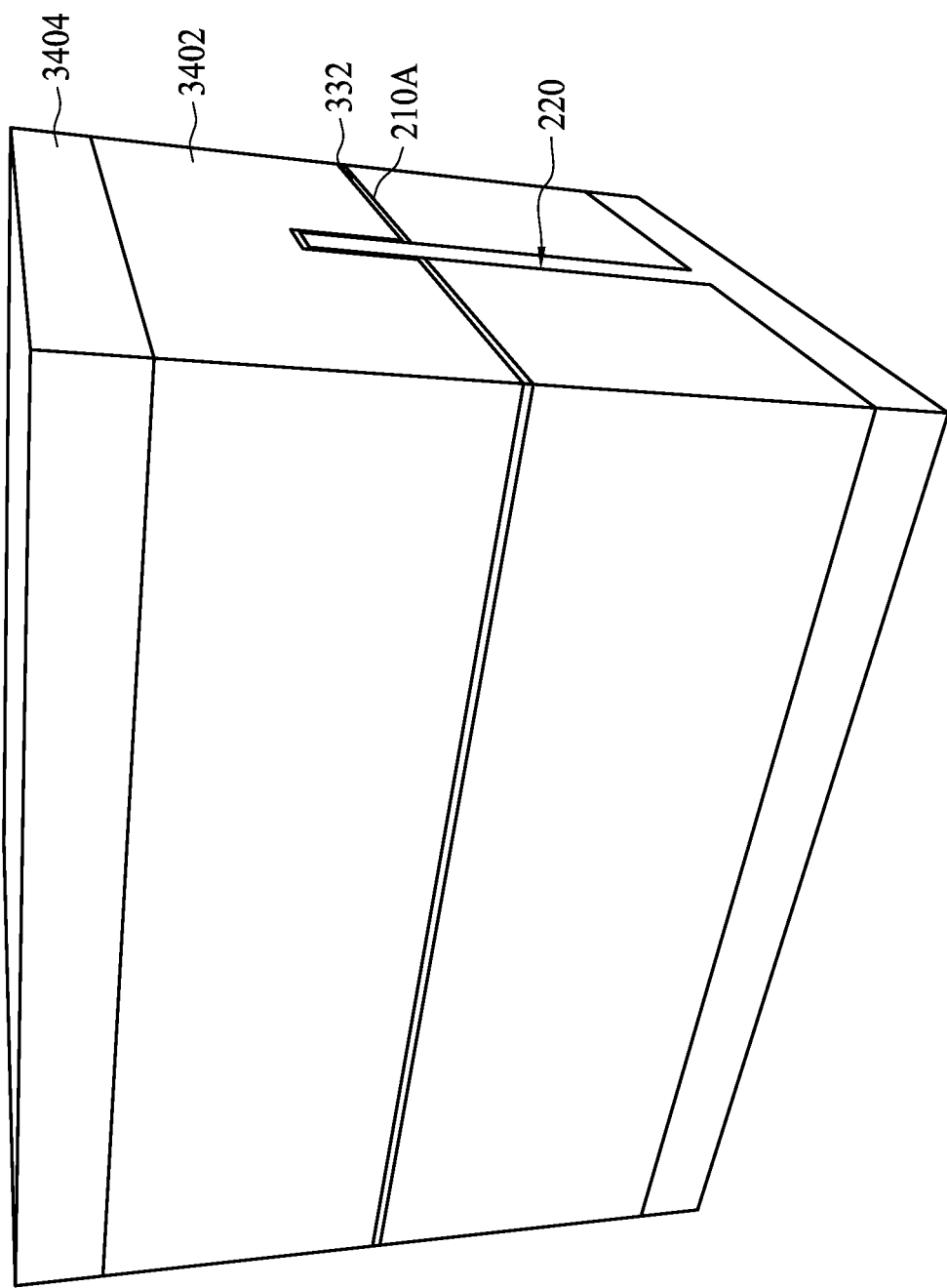

FIGS. 3 to 6 illustrate formation of a sacrificial gate structure 640 in accordance with some embodiments. In the embodiments described with references to FIGS. 2 to 13, the gate structure 140 shown in FIGS. 1A to 1C is formed by a replacement gate process. Referring to FIG. 3, an interfacial layer 332 is conformally formed on the top surfaces 210A of the dielectric isolation regions 210 and on the fin structure 220 extended beyond the top surfaces 210A. Exemplary materials for the interfacial layer 332 have been provided with references to FIGS. 1A to 1C. In some embodiments, the interfacial layer 332 is formed by a chemical oxide technique, thermal oxide technique, atomic layer deposition (ALD), chemical vapor deposition (CVD), or other suitable techniques. In some embodiments, a height of the interfacial layer 332 is between 5 Å to 50 Å.

In some embodiments, a sacrificial gate electrode layer 3402 is formed as a capping layer of the interfacial layer 332. In some embodiments, the sacrificial gate electrode layer 3402 includes polysilicon, or $Si_3N_4$. In some embodiments, the sacrificial gate electrode layer 3402 is deposited using physical vapor deposition (PVD), CVD, ALD, or other suitable deposition processes. In some embodiments, a height of the sacrificial gate electrode layer 3402 is between 300 Å to 2000 Å.

In some embodiments, one or more hard mask layers 3404 are blanket deposited on the sacrificial gate electrode layer 342. The one or more hard mask layers 3404 are formed of a material such that a hard mask 4404 (shown in FIG. 4) resulted from the one or more hard mask layers 3404 will not be significantly etched or eroded during patterning the sacrificial gate electrode layer 3402. In some embodiments, the sacrificial gate electrode layer 3402 includes polysilicon, and the one or more hard mask layers 3404 includes $SiO_2$, $Si_3N_4$, SiON, or combinations thereof. In other embodiments, the sacrificial gate electrode layer 3402 includes $Si_3N_4$ and the one or more hard mask layers include $SiO_2$, SiON, or combinations thereof. In some embodiments, the one or more hard mask layers 3404 are deposited using physical vapor deposition (PVD), CVD, ALD, or other suitable deposition processes. In some embodiments, the height of the one or more hard mask layers 3404 is between 300 Å to 1000 Å.

Figure 4:
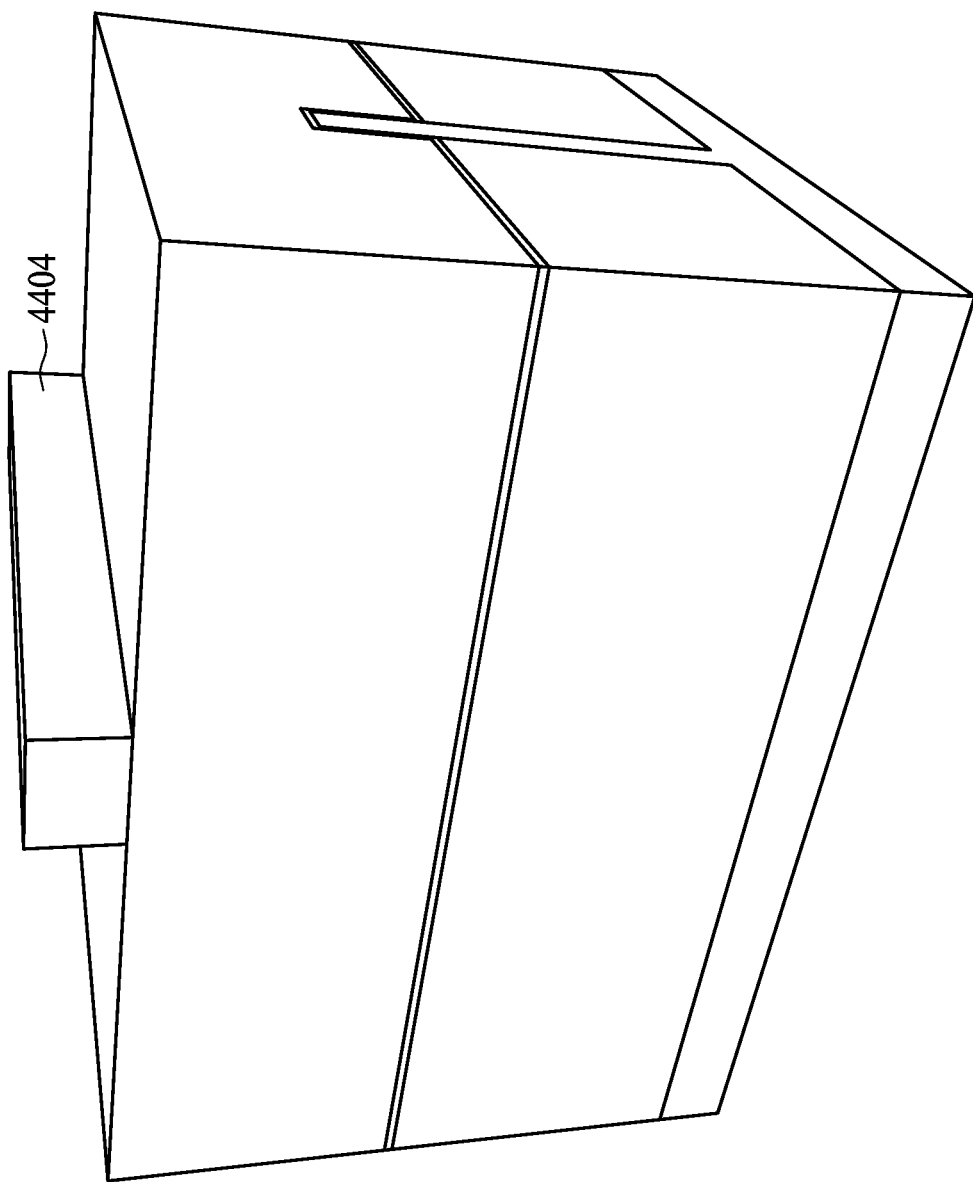

Referring to FIG. 4, the one or more hard mask layers 3404 (shown in FIG. 3) are patterned into a hard mask 4404 in accordance with some embodiments. In some embodiments, to pattern the one or more hard mask layers 3404 into the hard mask 4404, a photoresist mask is formed on the one or more hard mask layers 3404 using photolithography techniques. The photoresist mask defines an area where the gate structure 140 (shown in FIG. 1A) is located. Then, the one or more hard mask layers 3404 are etched in alignment with the photoresist mask using, for example, reactive ion etching (RIE), to form the hard mask 4404.

Figure 5:
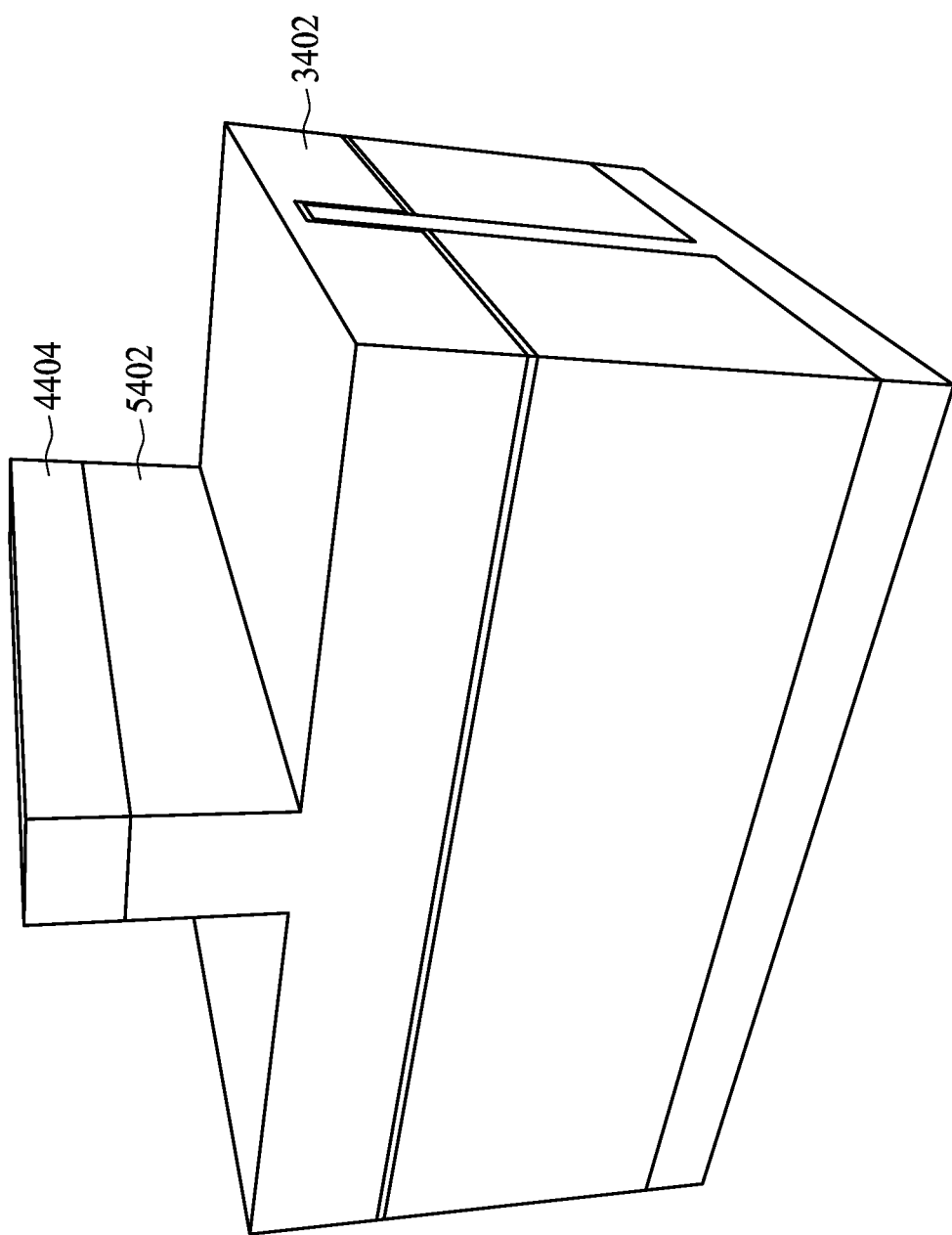
Figure 6:
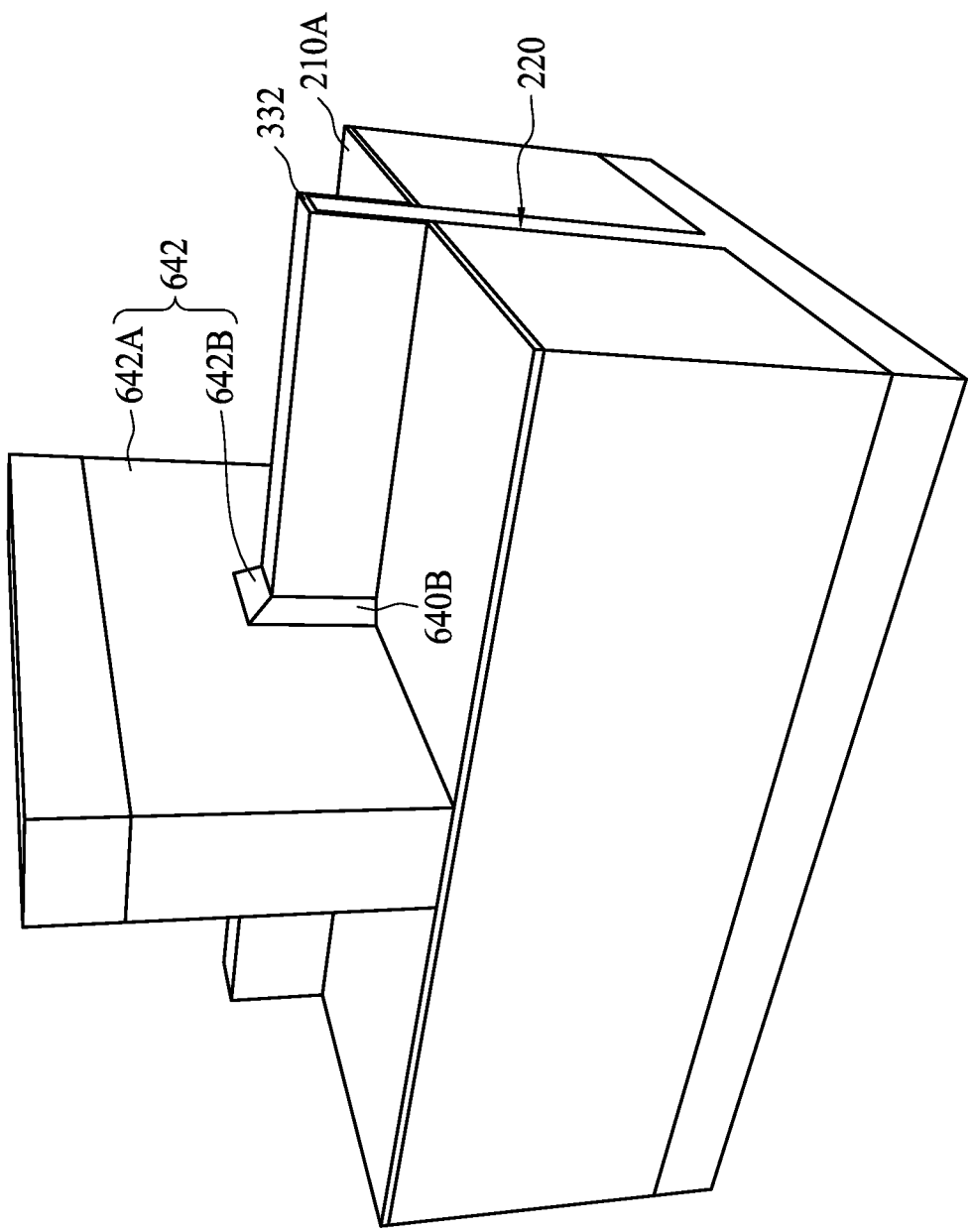

In some embodiments, the sacrificial gate electrode layer 3402 are etched using an anisotropic dry etching process such as plasma etching carried out in a high density plasma (HDP) reactor. Examples of a HDP reactor include an inductively coupled plasma (ICP) reactor and an electron cyclotron resonance (ECR) plasma reactor. In some embodiments, the anisotropic dry etching process includes a break through step, a first main etch step, a second main etch step and an over etch step. The break through step and the first main etch step are illustrated in FIG. 5, and the second main etch step and the over etch step are illustrated in FIG. 6. Referring to FIG. 5, when a gas chemistry in the first main etch step contains a gas or a gas mixture that has an etching selectivity of the material of the sacrificial gate electrode layer 3402 over native oxide formed on a surface of the sacrificial gate electrode layer 3402, the break through step is used to remove the native oxide. In the first main etching step, an upper portion 5402 of a central region 642A (shown in FIG. 6) of the sacrificial gate electrode 642 that is above the footing regions 642B is formed. In some embodiments, in the break through step and the first main etch step, process conditions for, for example, HDP etching include a pressure of 1 mTorr to 50 mTorr, a power of 100 W to 1000 W, a gas chemistry selected from a group consisting of HBr, $Cl_2$, $SF_6$, $N_2$, $CF_4$, $CHF_3$, $CH_4$, $CH_2F_2$, $N_2H_2$, $O_2$, He, and Ar, and a temperature of 10° C. to 65° C. In some embodiments, a higher pressure that ranges from 15 mTorr to 50 mTorr is used for the first main etch step so that a passivation layer that enhances anisotropy of the central region 642A is formed on side walls of the upper portion 5402 of the central region 642A.

Referring to FIG. 6, in the second main etch step and the over etch step, the rest of the sacrificial gate electrode 642 that includes a lower portion of a central region 642A and footing regions 642B are formed. In some embodiments, the second main etching step ends when an etching depth of the sacrificial gate electrode layer 3402 (shown in FIG. 3) initially reaches the interfacial layer 332. In some embodiments, in the over etching step, the leftover sacrificial gate electrode layer 3402 on the interfacial layer 332 resulting from non-uniform etch rates of the sacrificial gate electrode layer 3402 is removed. In other embodiments, the interfacial layer 332 is further etched in alignment with the sacrificial gate electrode 642. In some embodiments, in the second main etch step and the over etch step, process conditions for, for example, HDP etching include a pressure of 1 mTorr to 80 mTorr, a power of 100 W to 1000 W, a gas chemistry selected from a group consisting of HBr, $Cl_2$, $BCl_3$, $N_2$, $CH_4$, $CF_4$, $CHF_3$, $CH_2F_2$, $N_2H_2$, $O_2$, He, and Ar, and a temperature of 10° C. to 65° C. In some embodiments, a pressure higher than the first main etch step is used in the second main etch step, and the pressure is further increased in the over etch step so as to facilitate redeposition of polymer to form the passivation layer on the side walls of the central region 642A and to form the footing regions 140B along where the central region 642A interfaces the interfacial layer 332 that wraps around the fin structure 220.

Figure 7A:
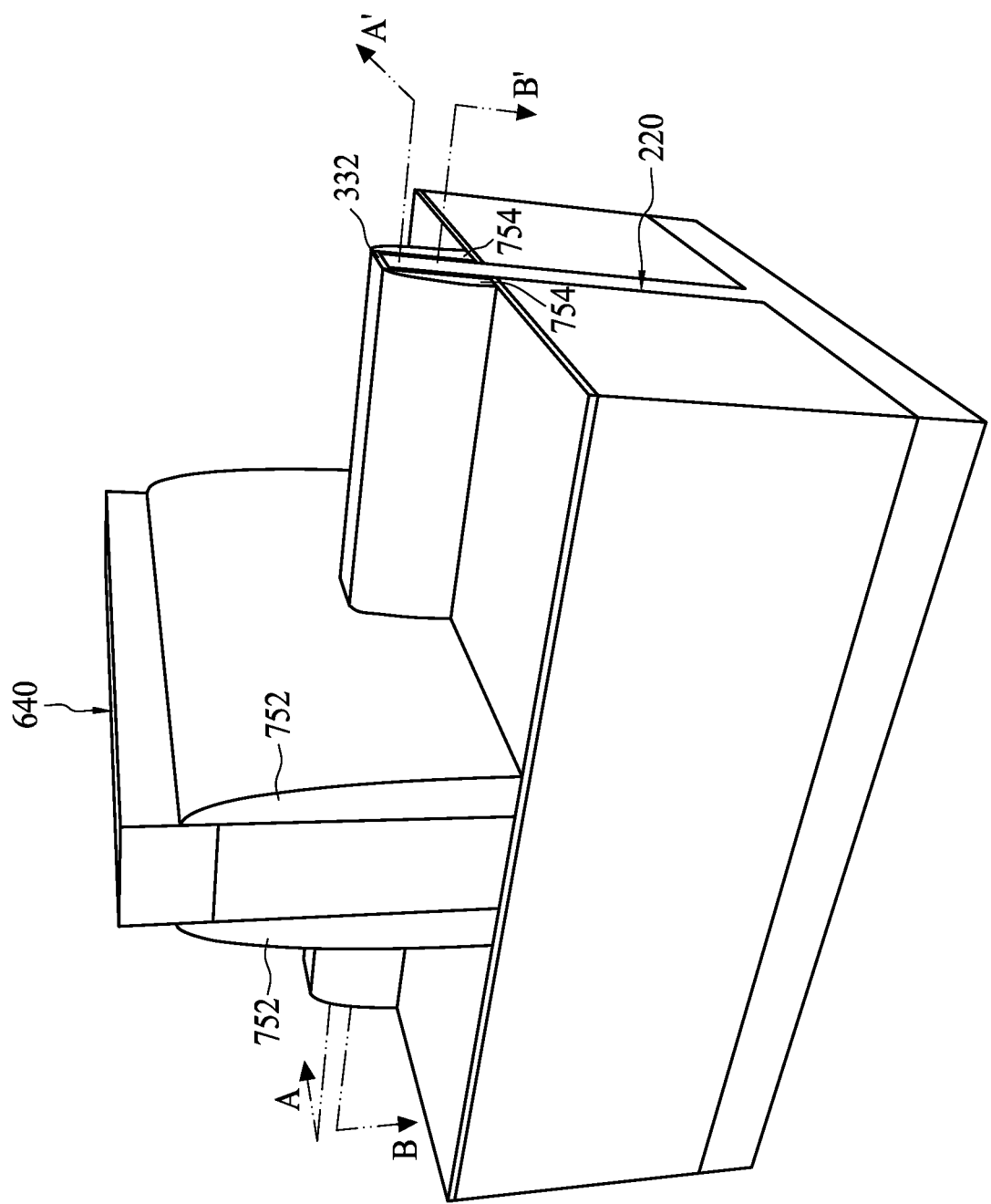

Referring to FIG. 7A, gate spacers 752 are formed on side walls of a sacrificial gate structure 640 and the fin spacers 754 are formed on side walls of the portion of the interfacial layer 332 wrapped around the fin structure 220. The side walls of the sacrificial gate structure 640 are formed across the gate length $L_g$ exemplarily shown in FIG. 1B. The side walls of the fin structure 220 are formed across the channel width $W_c$ shown in FIG. 1C. The sacrificial gate structure 640 includes the hard mask 4404 shown in FIG. 4 and the sacrificial gate electrode 642 shown in FIG. 6. In some embodiments, the gate spacers 752 and the fin spacers 754 includes $Si_3N_4$, SiON, SiOCN, SiCN, $SiO_2$, or combinations thereof. There are one or more layers forming the gate spacers 752, and one or more layers forming the fin spacers 754. In some embodiments, one or more dielectric materials of the gate spacers 752 and the fin spacers 754 are blanket deposited on the interfacial layer 332 and the sacrificial gate structure 640 by CVD, or other suitable deposition processes. Then, the layer formed of the one or more dielectric materials are etched using, for example, an isotropic etching process, to form the gate spacers 752 and the fin spacers 754 on the side walls of the sacrificial gate structure 640 and the fin structure 220 wrapped around by the interfacial layer 332.

Figure 7B:
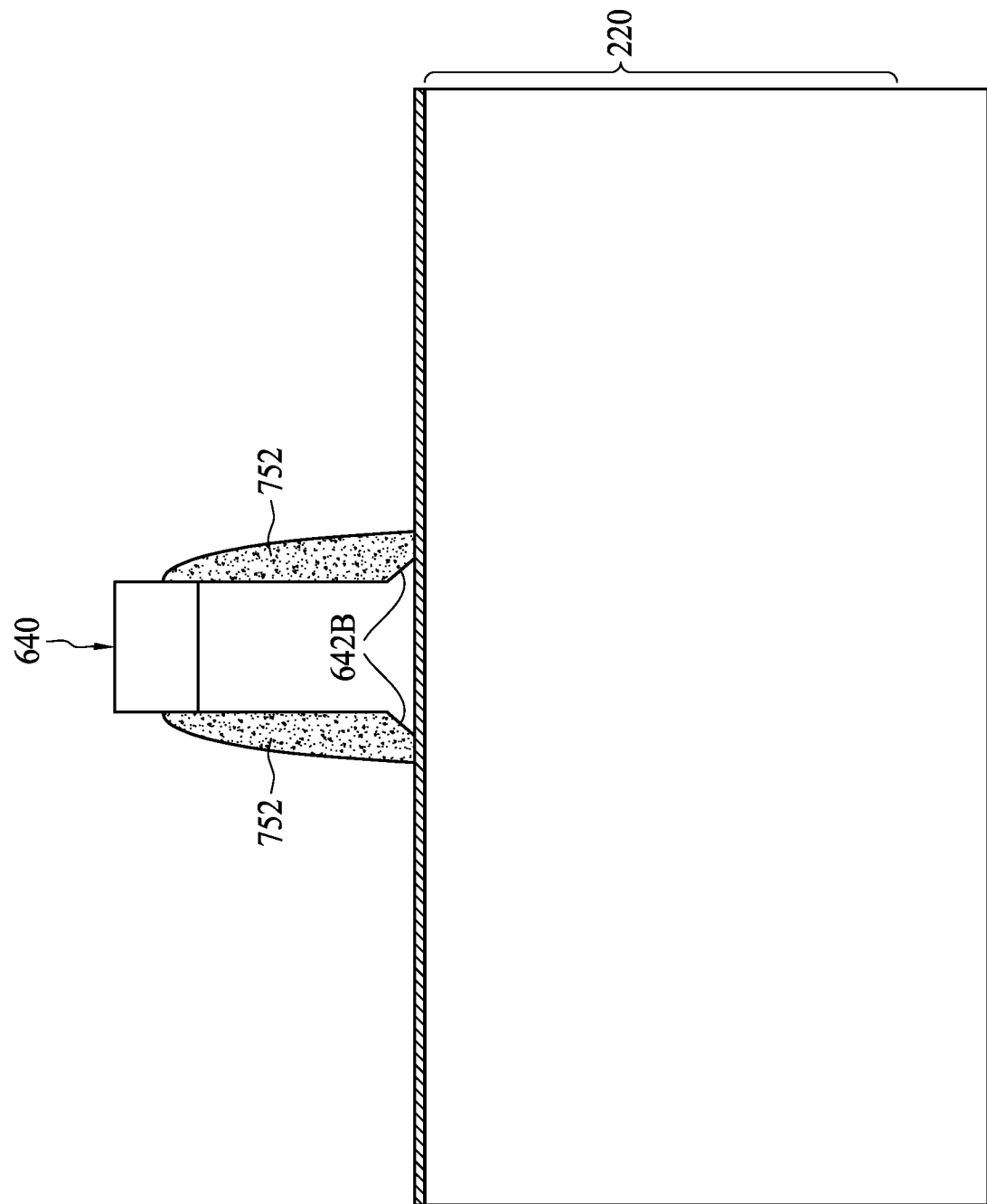

FIGS. 7B and 7C are cross-sectional diagrams of the semiconductor structure along line A-A' and B-B' in FIG. 7A, respectively, in accordance with some embodiments. Referring to FIG. 7B, the gate spacer 752 adjacent to the portion of the sacrificial gate structure 640 above the top side of the fin structure 220 is indented to conform to the shape of the footing regions 642B. Referring to FIG. 7C, at each corner between the sacrificial gate structure 640 and the fin structure 220, the gate spacer 752 and the fin spacer 754 has an L-shaped cross section with an indented corner to conform to the shape of the corresponding footing region 642B. For each different corner between the sacrificial gate structure 640 and the fin structure 220, the L-shaped cross section has a different orientation.

Figure 8A:
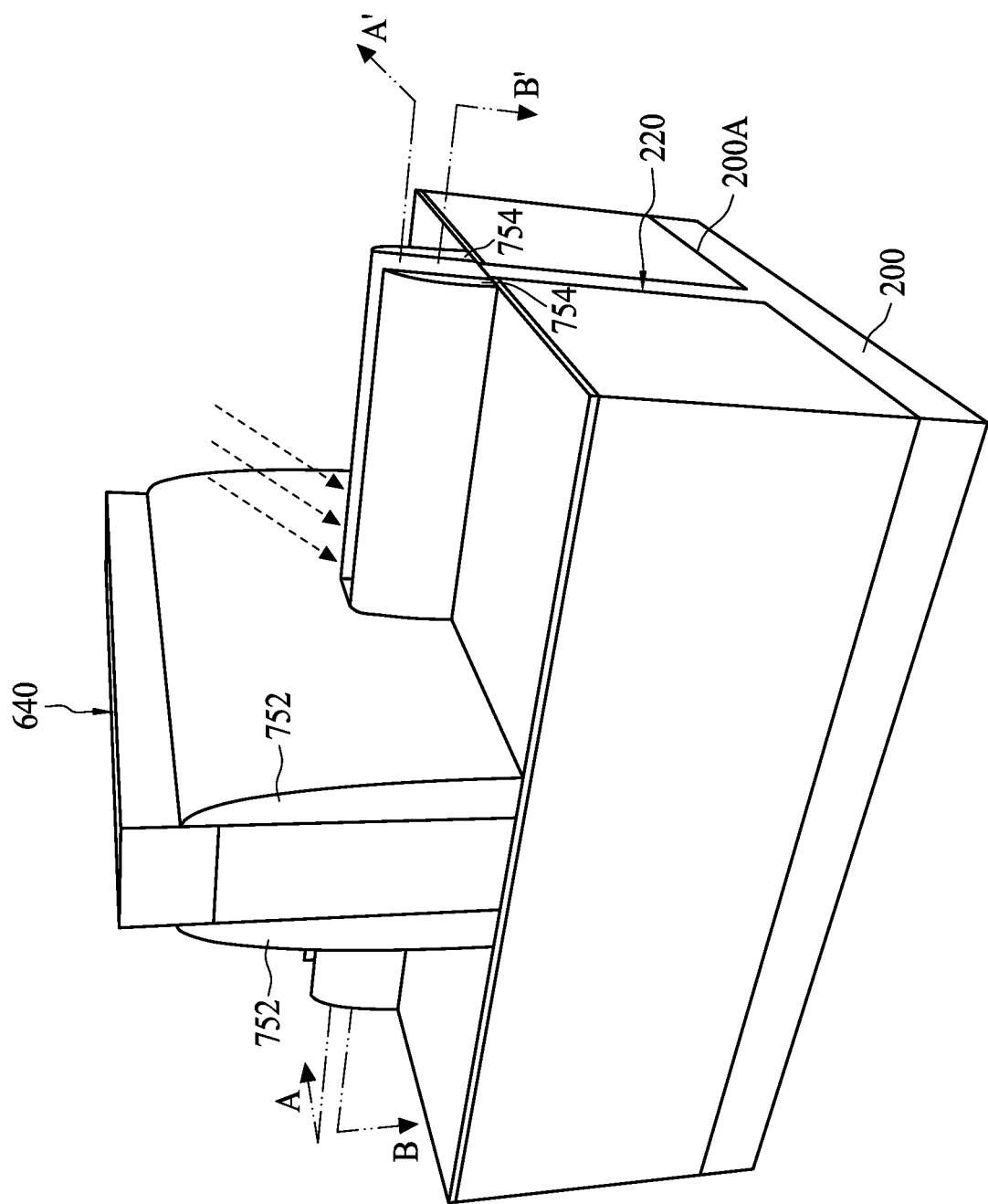

Referring to FIG. 8A, lightly doped source and drain extensions 1242 and 1262 shown in FIGS. 1B and 1C are formed in the fin structure wrapped around by the gate spacers 752. In some embodiments, to form the source and drain extensions 1242 and 1262, portions of the fin structure 220 and the interfacial layer 332 (both shown in FIG. 7A) extend laterally beyond the gate spacers 752 are removed. In other words, portions of the fin structure 220 and the interfacial layer 332 sandwiched by the fin spacers 754 are removed. In some embodiments, the portions of the interfacial layer 332 and the fin structure 220 are removed using a dry etching process. Then, the lightly doped source and drain extensions are formed in the remaining portion of the fin structure 220 by ion implantation, as shown by the dotted arrows in FIG. 8A. Exemplary materials for p-type dopants and n-type dopants have been provided with references to FIGS. 1A to 1C. In some embodiments, dopant ions are implanted at an angle of about 50° to 90° relative to a surface of incidence at a dose of about 5E13 to about 2E15 atoms/$cm^2$ and at an energy of about 2 to about 5 KeV.

Figure 8B:
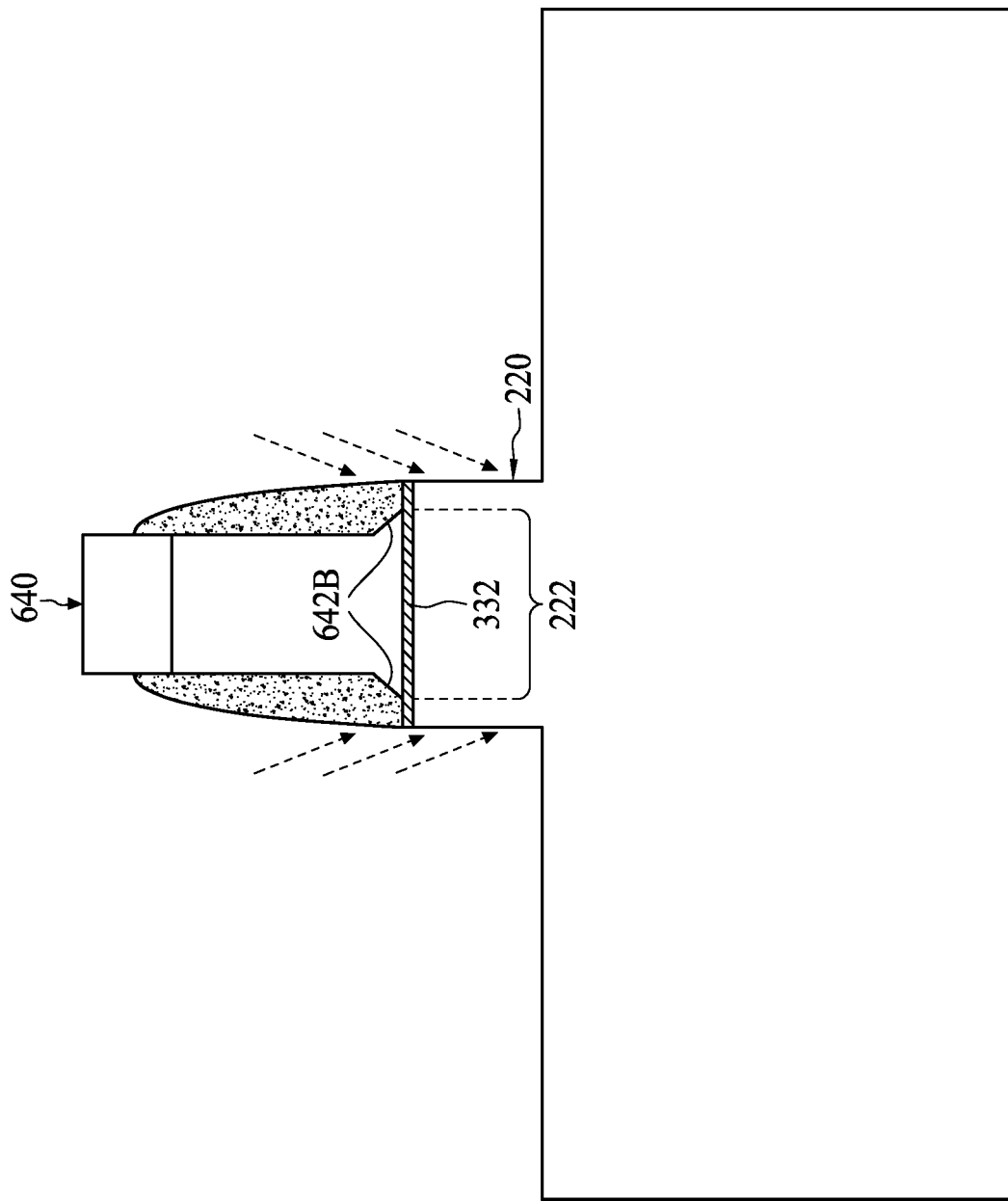
Figure 8C:
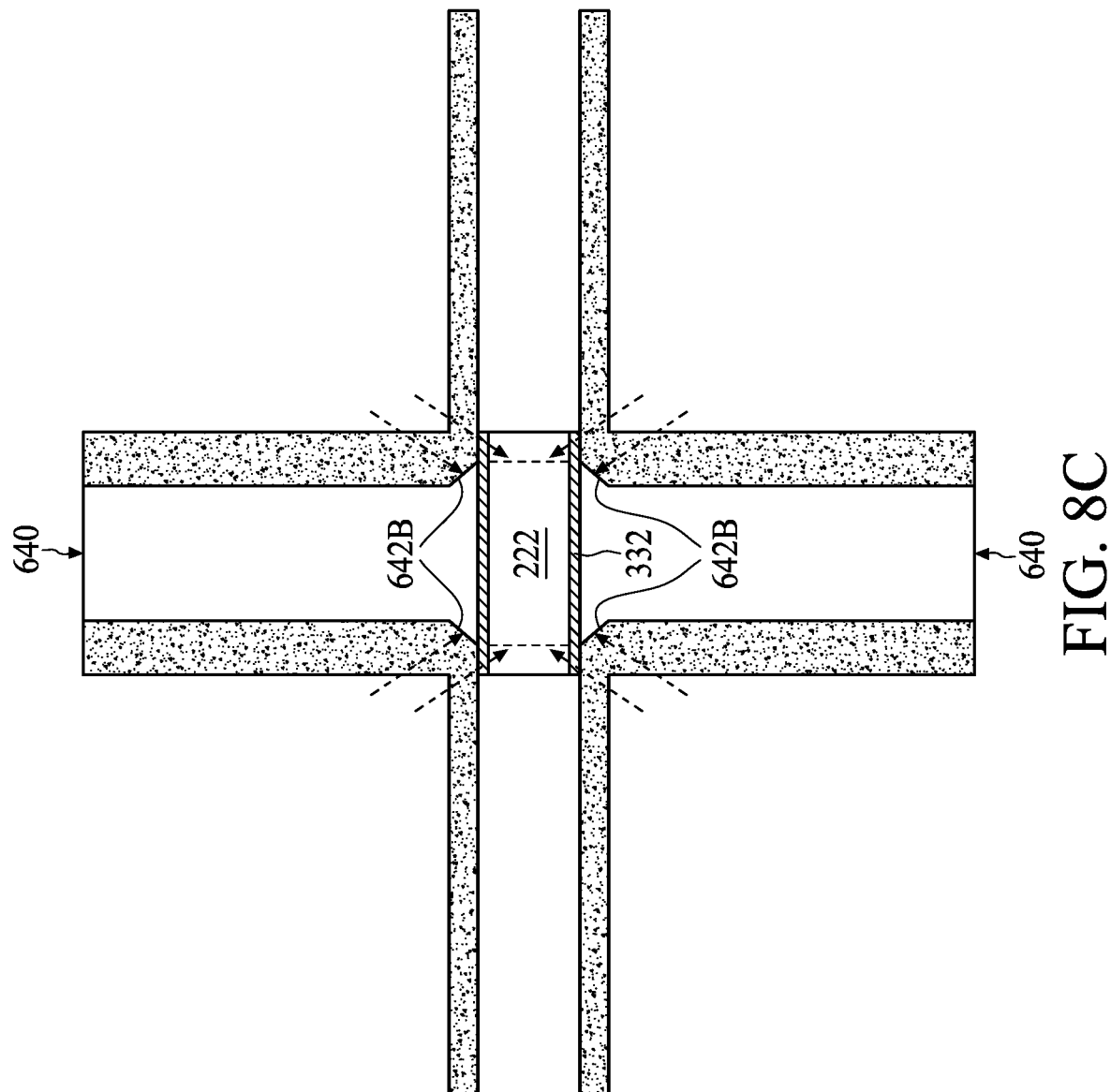

FIGS. 8B and 8C are cross-sectional diagrams of the semiconductor structure along line A-A' and B-B' in FIG. 8A, respectively, in accordance with some embodiments. In some embodiments, the surfaces of incidence include the surfaces on opposite ends of the channel region 222, respectively. FIG. 8B illustrates that the footing regions 642B protect the interfacial layer 332 formed on the top side of the channel region 222 from being damaged by the ion implantation. When implantation is tilted, an incident ion beam has both vertical and lateral components with respect to the surface of incidence. The tapered profile of the footing regions 642B along the top side of the channel region 222 blocks both the vertical component and lateral component of the incident ion beam from damaging the interfacial layer 332 that interfaces with the sacrificial gate structure 640. In addition, in some embodiments, the surfaces of incidence further include the surfaces on the lateral sides of the channel region 222, respectively. FIG. 8C illustrates that the footing regions 642B protect the interfacial layer 332 formed on the lateral sides of the channel region 222 from being damaged by the ion implantation. The tapered profile of the footing regions 642B along the lateral sides of the channel region 222 blocks both the vertical component and lateral component of the ion beam incident onto each surface of incidence from damaging the interfacial layer 332 that interfaces with the sacrificial gate structure 640.

Figure 9:
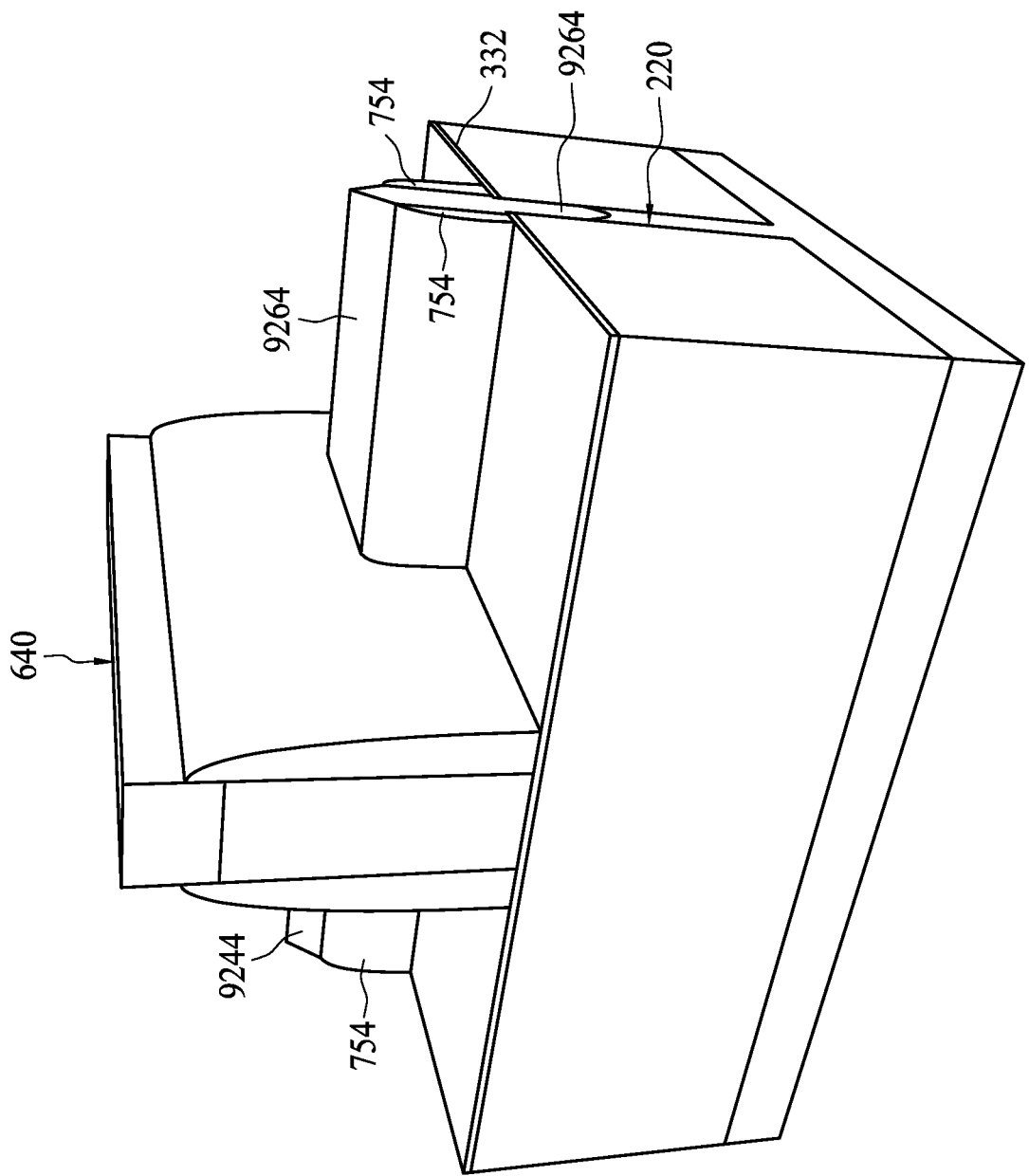

Referring to FIG. 9, embedded stressor regions 9244 and 9264 are formed on opposite ends of the channel region 1222 (shown in FIG. 1B) in accordance with some embodiments. The opposite ends of the channel region 1222 are formed across the gate length $L_g$. In some embodiments, to form the embedded stressor regions 9244 and 9264, the fin structure 220 shown in FIG. 8 is further etched to form source and drain recesses by, for example, a dry etching process. Then, a stressor material is grown in the source and drain recesses using a selective epitaxial deposition process to form the embedded stressor regions 9244 and 9264. In some embodiments, the embedded stressor regions 9244 and 9264 are grown beyond the source and drain recesses. The embedded stressor regions 9244 and 9264 are raised above the channel region 1222 but are confined by the fin spacers 754 along the width $W_c$ of the channel region 1222 shown in FIG. 1C. In some embodiments, because the portions of the embedded stressor regions 9244 and 9264 above the channel region 1222 are freely grown, facets are eventually formed.

Figure 10:
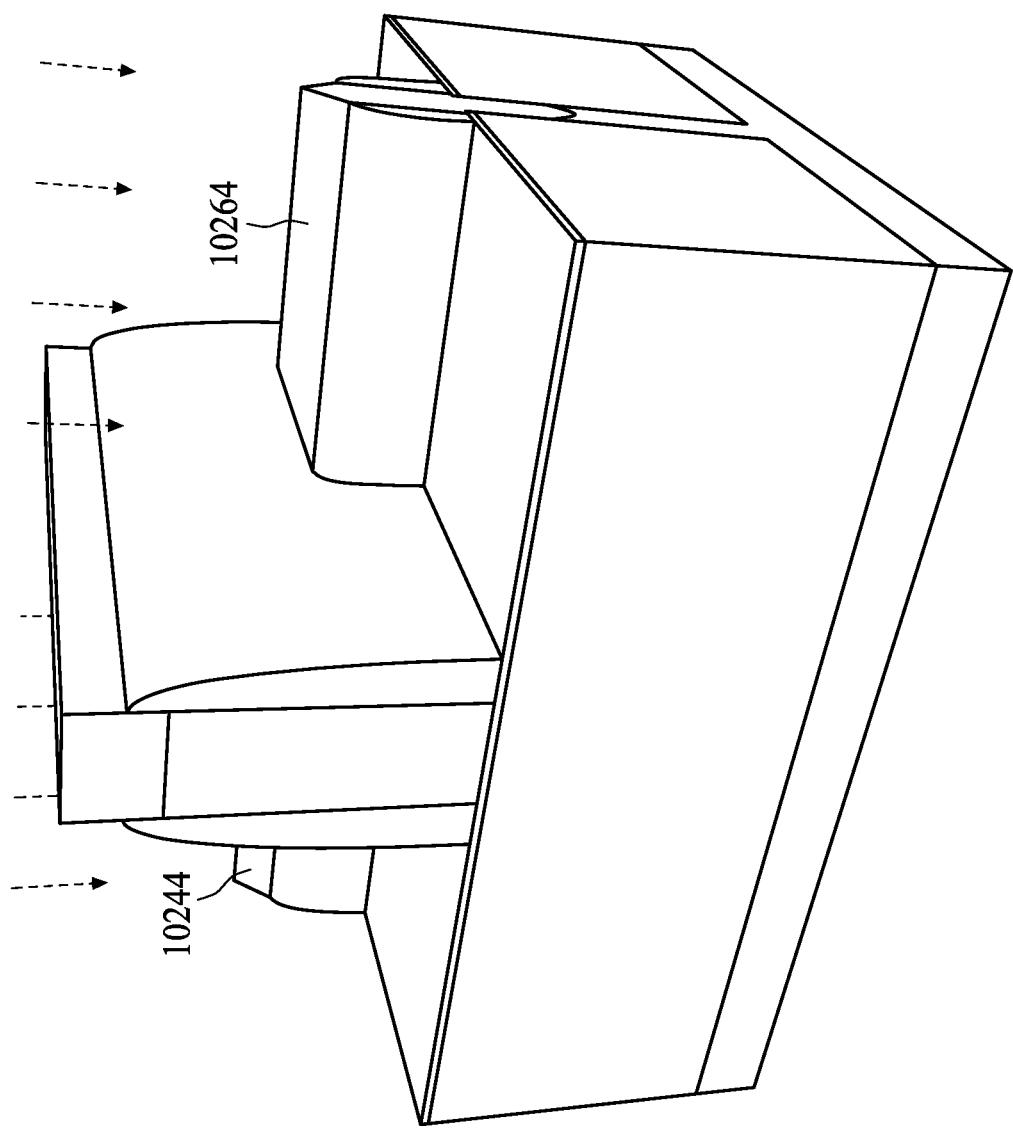

Referring to FIG. 10, the embedded source and drain regions 10266 are formed by doping the embedded stressor regions 9244 and 9264 shown in FIG. 9 in some embodiments. Exemplary materials for p-type dopants and n-type dopants have been provided with references to FIGS. 1A to 1C. In some embodiments, dopant ions are implanted at an angle of about 50° to 90° relative to a surface of incidence at a does about 1E14 to 1E16 atoms/cm² and at an energy of about 5 to 20 keV. The manner with which the footing regions 642B (shown in FIG. 8) protect the interfacial layer 332 (shown in FIG. 8) are similar to some embodiments that will be described with references to FIGS. 14A to 14C and are omitted here. In other embodiments, the embedded source and drain regions 10244 and 10264 is in-situ doped as the stressor material is grown to fill the source and drain recesses.

Figure 11:
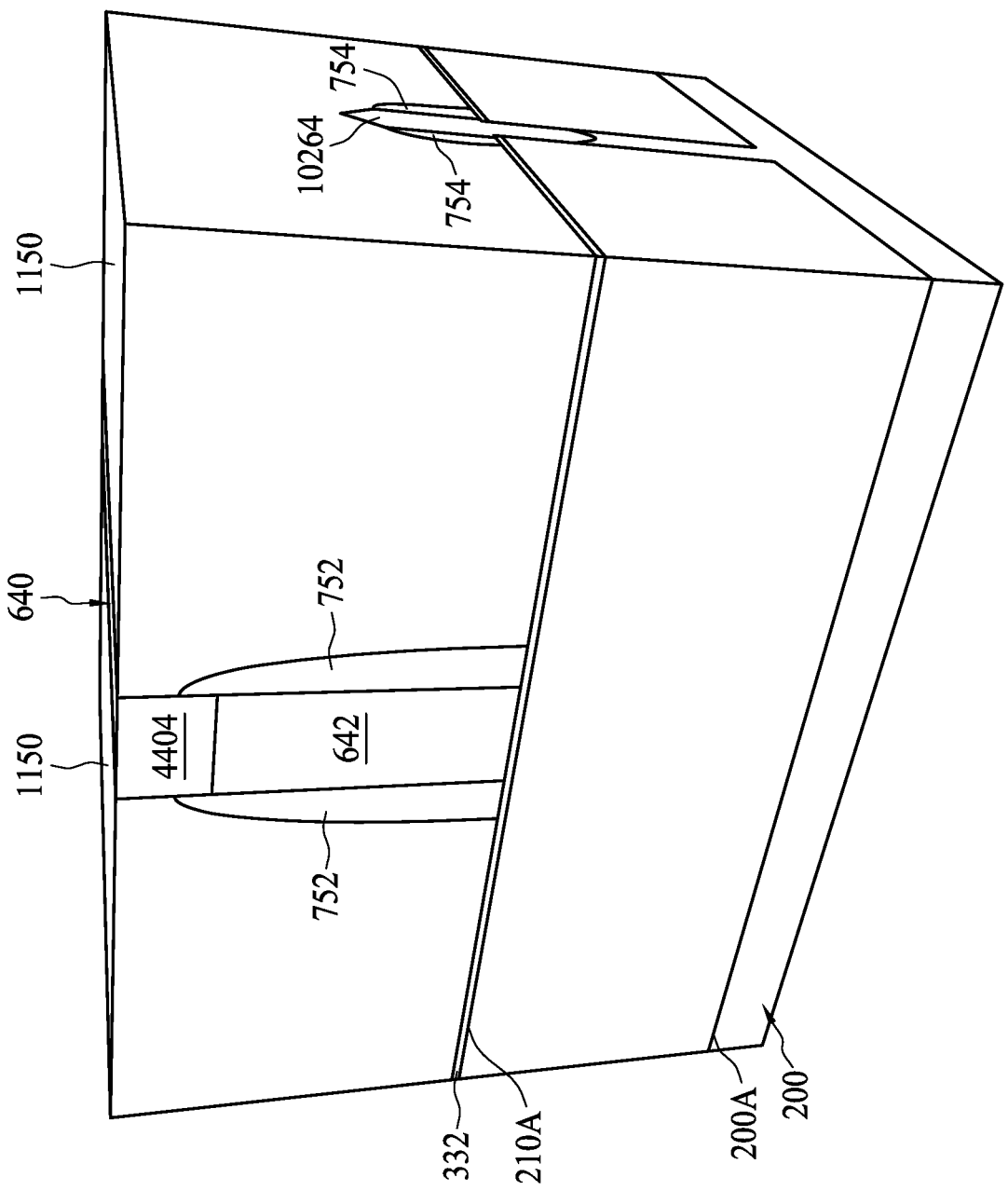

Referring to FIG. 11, inter-layer dielectric (ILD) regions 1150 surrounding the sacrificial gate structure 640 are formed. In some embodiments, to form the ILD regions 1150, an ILD layer is blanket deposited over the top surface 200A of the substrate 200. In other words, the ILD layer is formed on the interfacial layer 332, the exposed embedded source and drain regions (only 10264 is shown), the fin spacers 754, the exposed sacrificial gate structure 640 and the gate spacers 752. Then, the ILD layer is planarized until top surfaces of the ILD regions 1150 are planar the top surface of the sacrificial gate structure 640. The ILD regions 1150 are formed of one or more dielectric materials such that the sacrificial gate structure 640 can be removed without significantly affecting the ILD regions 1150.

Figure 12:
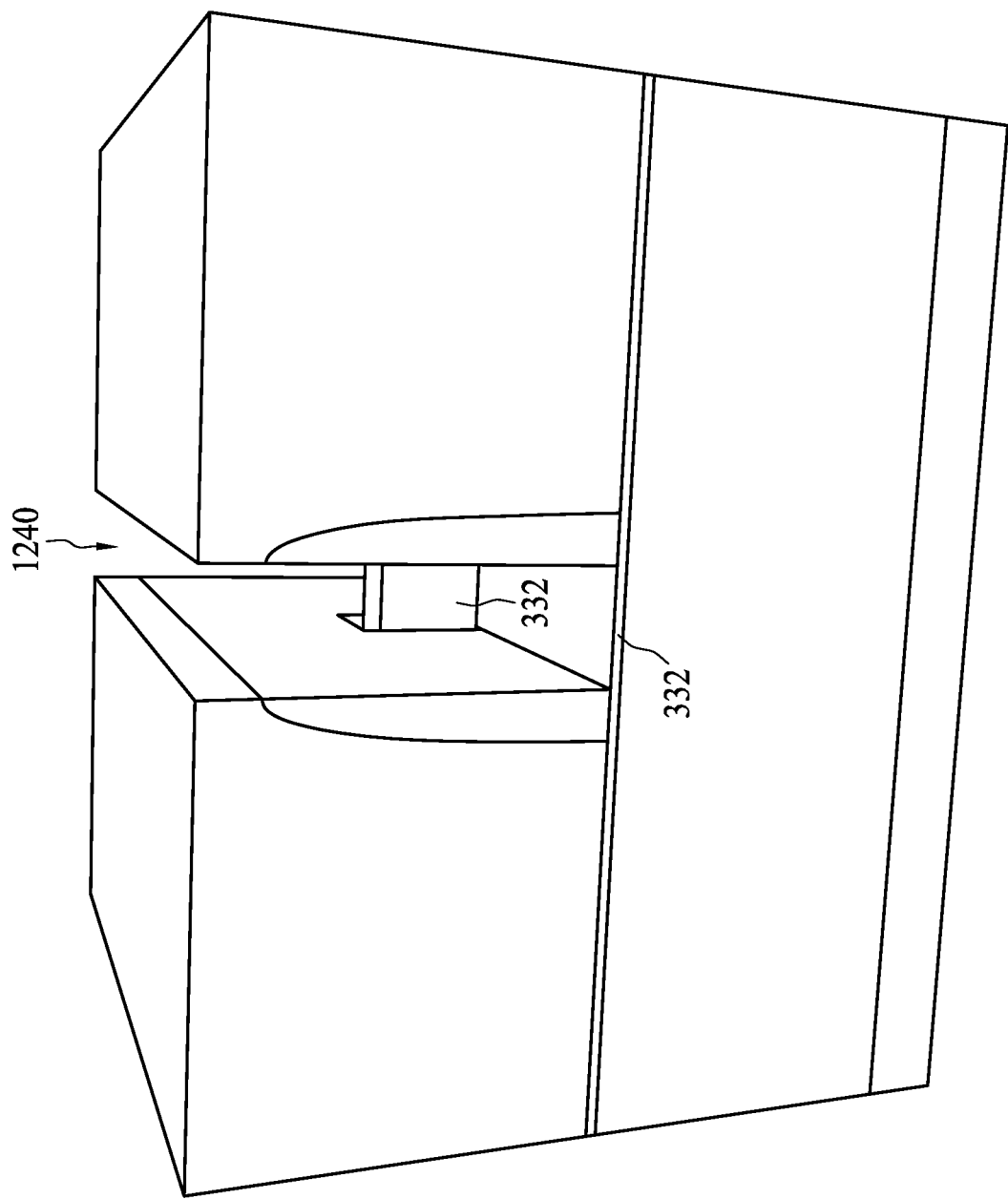

Referring to FIG. 12, the sacrificial gate structure 640 shown in FIG. 11 is removed in accordance with some embodiments. In some embodiments, the hard mask 4404 and the sacrificial gate electrode 642 shown in FIG. 11 are removed in sequence. Removal of the sacrificial gate structure 640 exposes the underlying interfacial layer 332 and forms an opening 1240 in which gate structure 140 illustratively shown in FIGS. 1A to 1C is to be formed.

Figure 13:
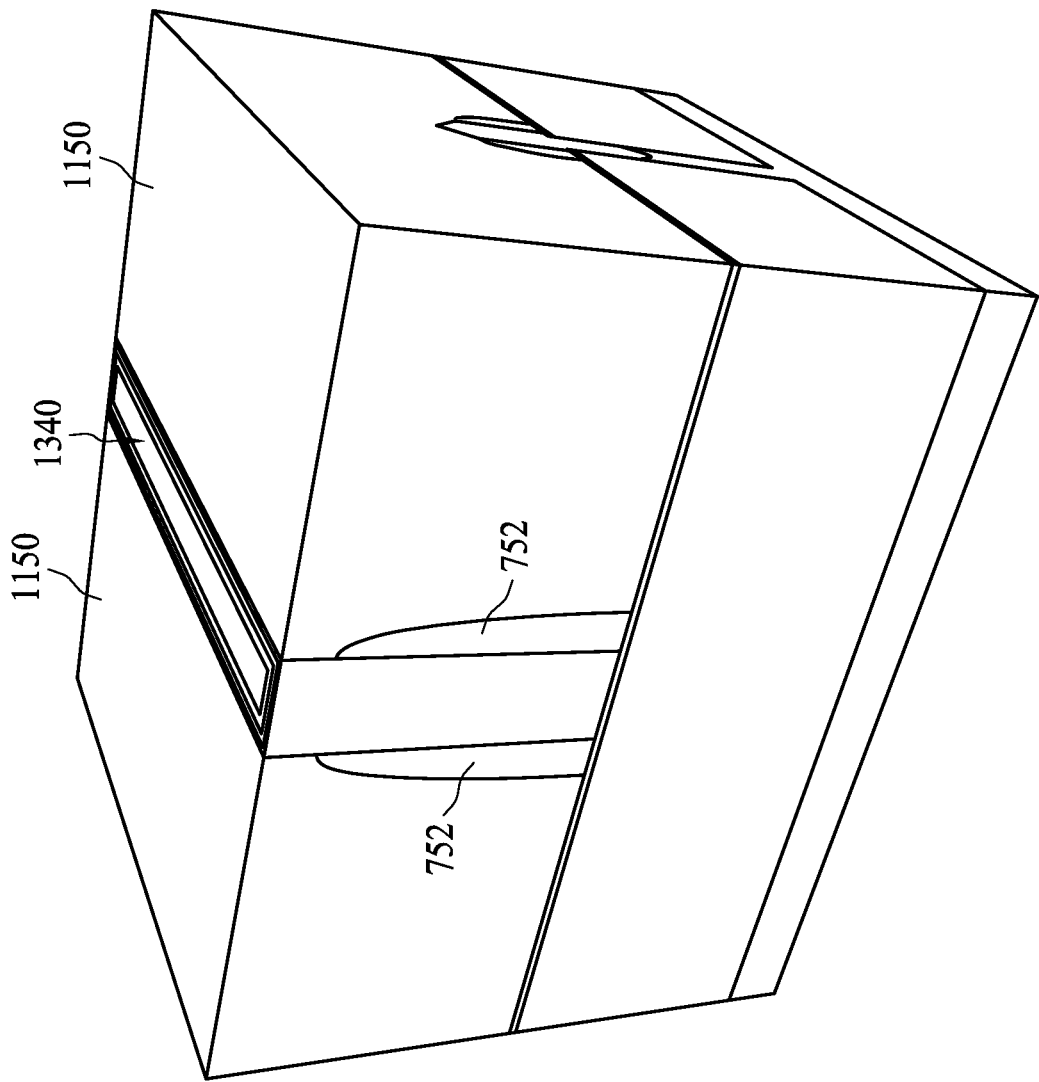

Referring to FIG. 13, a gate structure 1340 is formed in the opening 1240 shown in FIG. 12 in accordance with some embodiments. The gate structure 1340 replaces the sacrificial gate structure 640 illustratively shown in FIG. 11. In some embodiments, to fill the opening 1240 with the gate structure 1340, one or more gate dielectric layers are conformally deposited on the exposed interfacial layer 332, side walls of the gate spacers 752, and side walls and top surfaces of the ILD regions 1150. Exemplary materials of the gate dielectric 142 resulted from the one or more gate dielectric layers have been provided with references to FIGS. 1B and 1C. In some embodiments, the one or more gate dielectric layers are deposited using CVD or ALD. Then, one or more work function metal layers are conformally deposited on the one or more gate dielectric layers. Exemplary materials of the one or more work function metal layers 144 in the gate electrode 143 resulted from the one or more work function metal layers have been provided with references to FIGS. 1B and 1C. Then, a fill metal is formed as a capping layer filling the remaining of the opening 1240, and covering the work function metal layer over the top surface of the ILD regions 1150. Subsequently, the fill metal, the one or more work function metal layers and the one or more gate dielectric layers formed on the top surfaces of the ILD regions 1150 are removed by, for example, CMP, to form the fill metal 146, the work function metal layer 144 and the gate dielectric 142 in the gate structure 140.

Figure 14A:
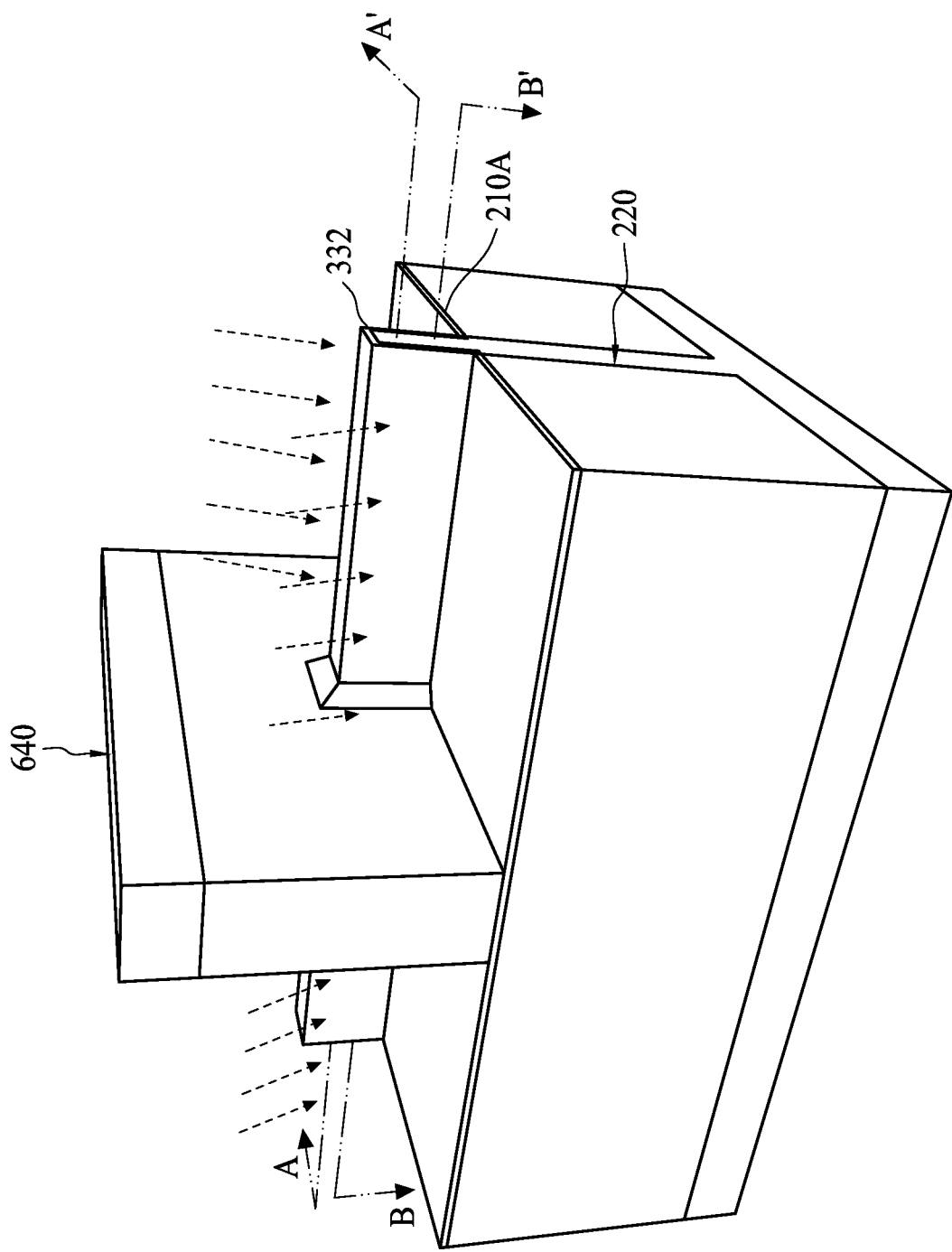
Figure 14B:
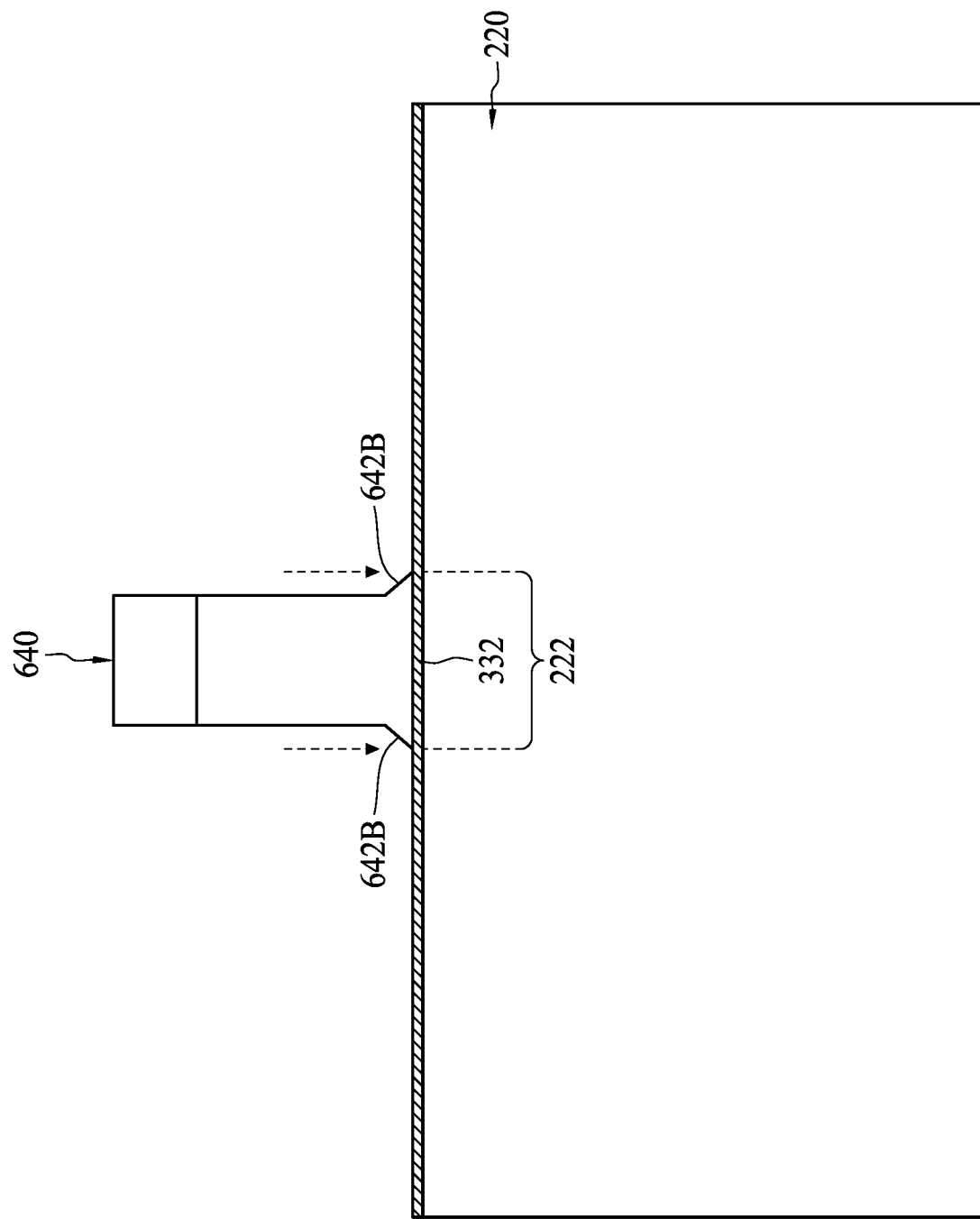
FIGS. 14B and 14C are cross-sectional diagrams along line A-A' and line B-B' in FIG. 14A, respectively.
Figure 14C:
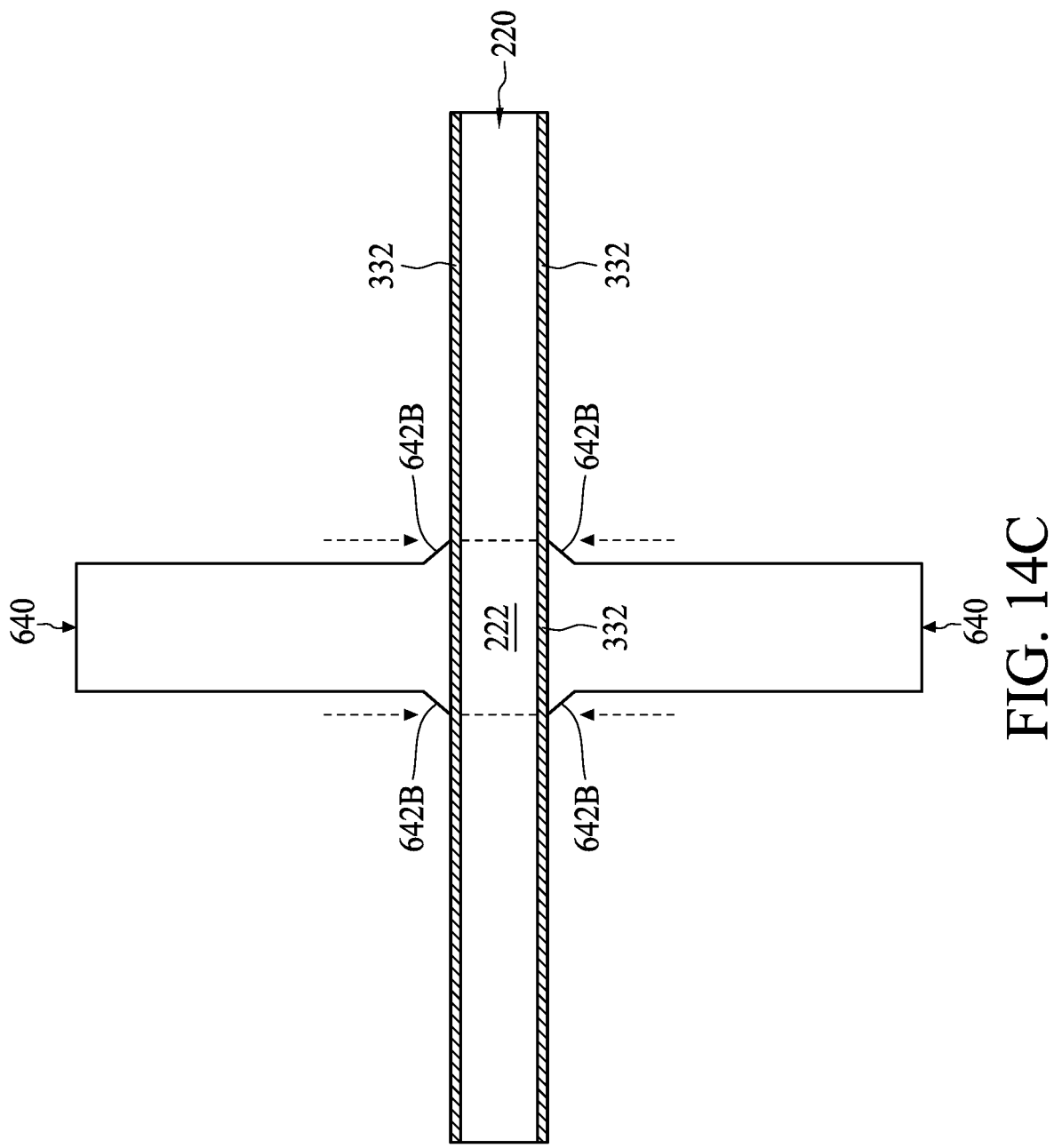
Figure 15:
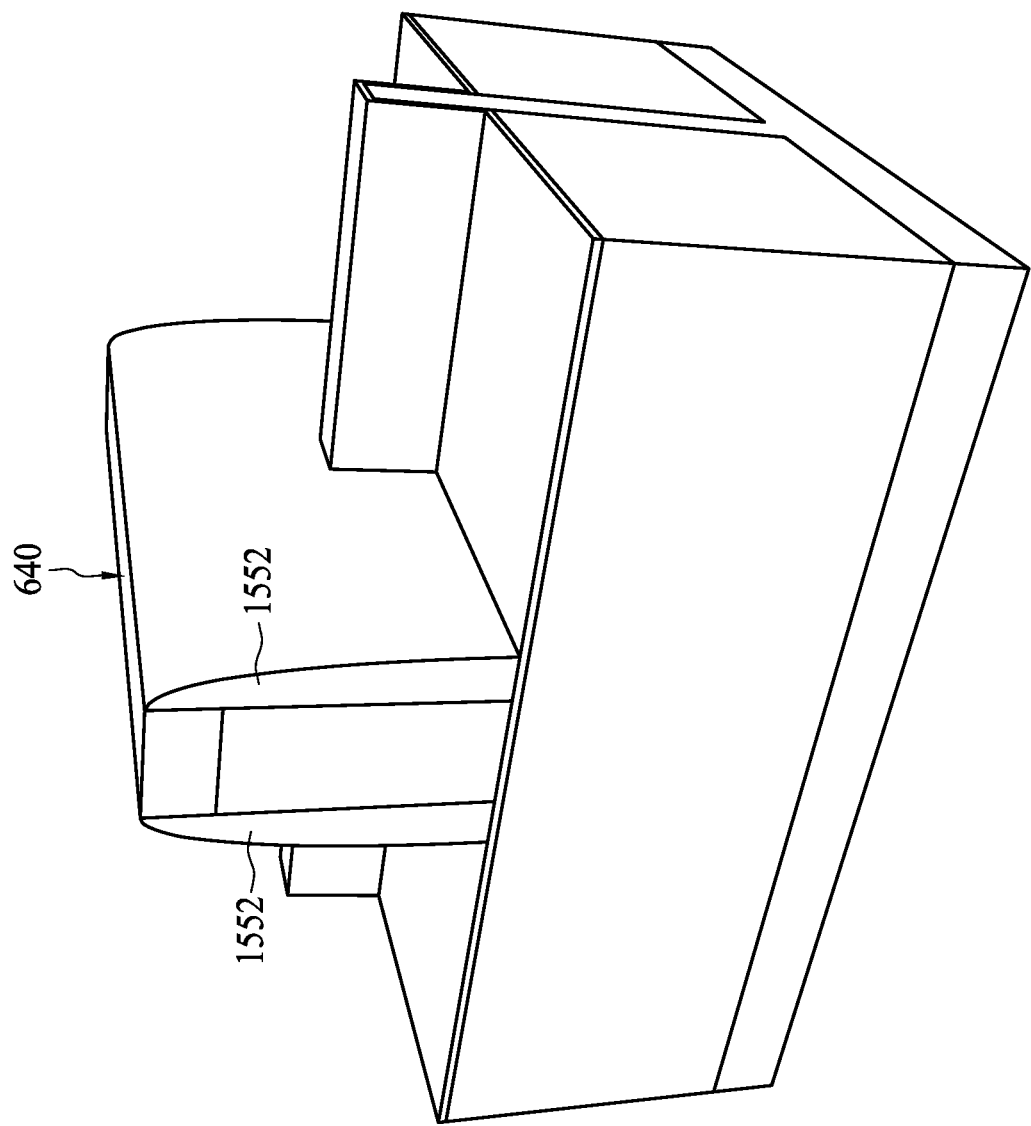
Figure 16:
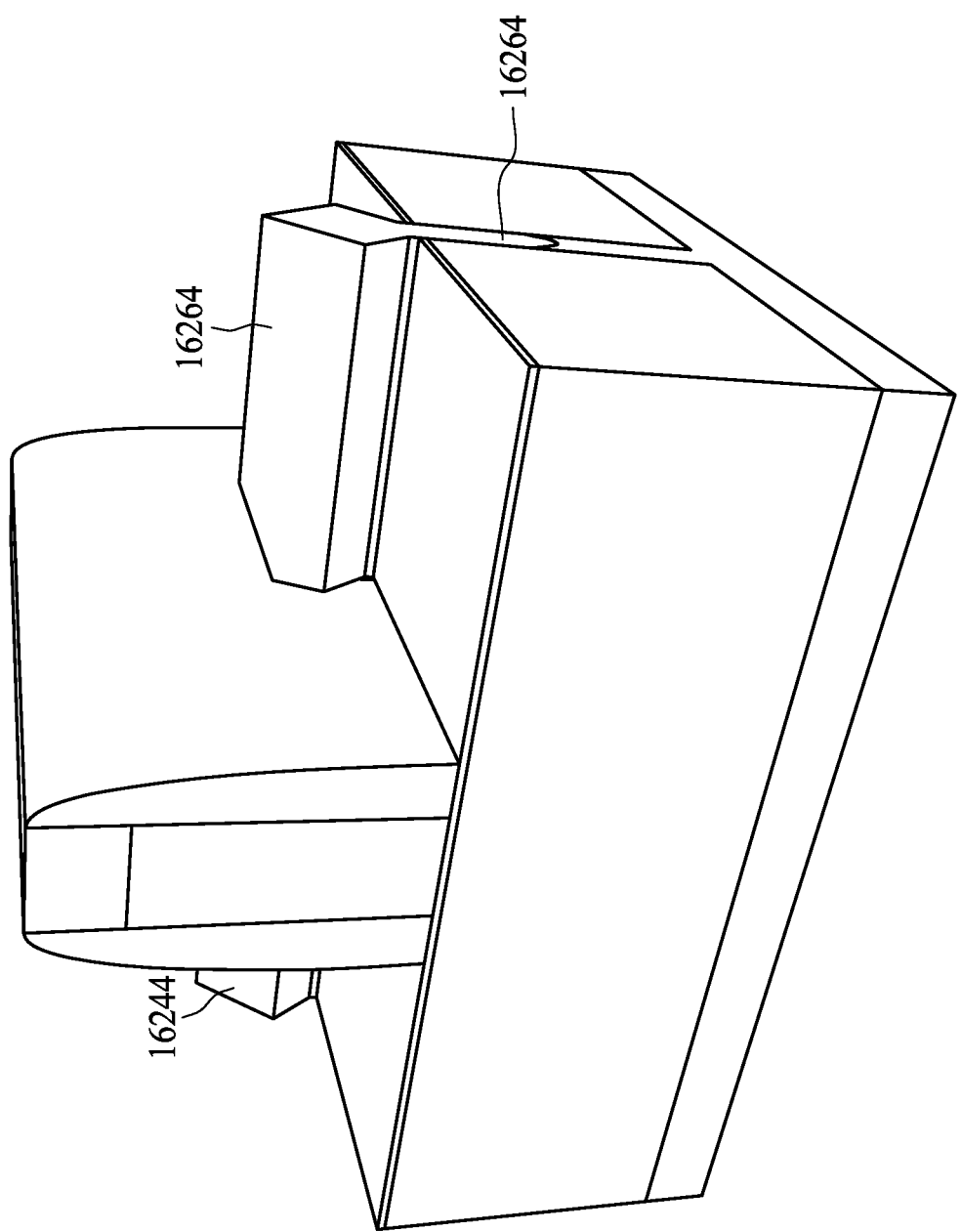

FIGS. 14 to 16 are schematic diagrams illustrating semiconductor structures formed by operations after the formation of the sacrificial gate structure 640 in FIG. 6 in accordance with other embodiments. FIGS. 14A, 15 and 16 are perspective diagrams and FIGS. 14B and 14C are cross-sectional diagrams. Referring to FIG. 14A, lightly doped source and drain extensions 1242 and 1262 shown in FIGS. 1B and 1C are formed in the fin structure 220 on the opposite sides of the sacrificial gate structure 640 formed across the gate length $L_g$. Compared to the embodiments shown in FIG. 8A, portions of the interfacial layer 332 and the fin structure 220 on the opposite sides of the sacrificial gate structure 640 are not removed. Further, the dopant ions are implanted at an angle of about 0° to ±80° relative to the side walls of the fin structure 220 across the width $W_c$ (exemplarily shown in FIG. 1C) of the fin structure 220. As shown in FIG. 14A, in some embodiments, the dopant ions are implanted across the fin structure 220 on opposite sides of the sacrificial gate structure 640.

FIGS. 14B and 14C are cross-sectional diagrams of the semiconductor structure along line A-A' and B-B' in FIG. 14A, respectively, in accordance with some embodiments. FIG. 14B illustrates that the footing regions 642B protects the interfacial layer 332 formed on the top side of the channel region 222 from being damaged by the ion implantation. In some embodiments, because an ion beam is rotated or tilted relative to the side walls of the fin structure 220, in the cross-sectional view in FIG. 14B, only a vertical component of the ion beam is seen by the footing region 642B. Further, in the cross-sectional view in FIG. 14C, only a lateral component of the ion bean is seen by the footing region 642B. In both views, the tapered profile of the footing region 642B blocks the incident ion beam from damaging the interfacial layer 332 that interfaces with the sacrificial gate structure 640.

Referring to FIG. 15, gate spacers 1552 are formed on the side walls of the sacrificial gate structure 640 in accordance with some embodiments. Compared to the embodiments shown in FIG. 7A, the fin spacers 754 illustratively shown in FIG. 7A have not been formed. Exemplary materials of the gate spacers 1552 have been provided with reference to FIG. 7A.

Referring to FIG. 16, embedded stressor regions 16244 and 16264 are formed on opposite ends of the channel region 1222 (shown in FIG. 1B) in accordance with some embodiments. Compared to the embodiments described with reference to FIG. 9, the growth of the embedded stressor regions 16244 and 16264 is not confined by the fin spacers 754 (shown in FIG. 7A). Therefore, the embedded stressor regions 16244 and 16264 are not only raised above the channel region 1222 but also are expanded beyond the width $W_c$ (shown in FIG. 1C) of the channel region 1222. In some embodiments, because the portions of the embedded stressor regions 16244 and 16264 beyond the channel region 1222 are freely grown, facets are eventually formed. The operations following FIG. 16 are similar to those described with references to FIGS. 11 to 13 and are omitted here.

Figure 17:
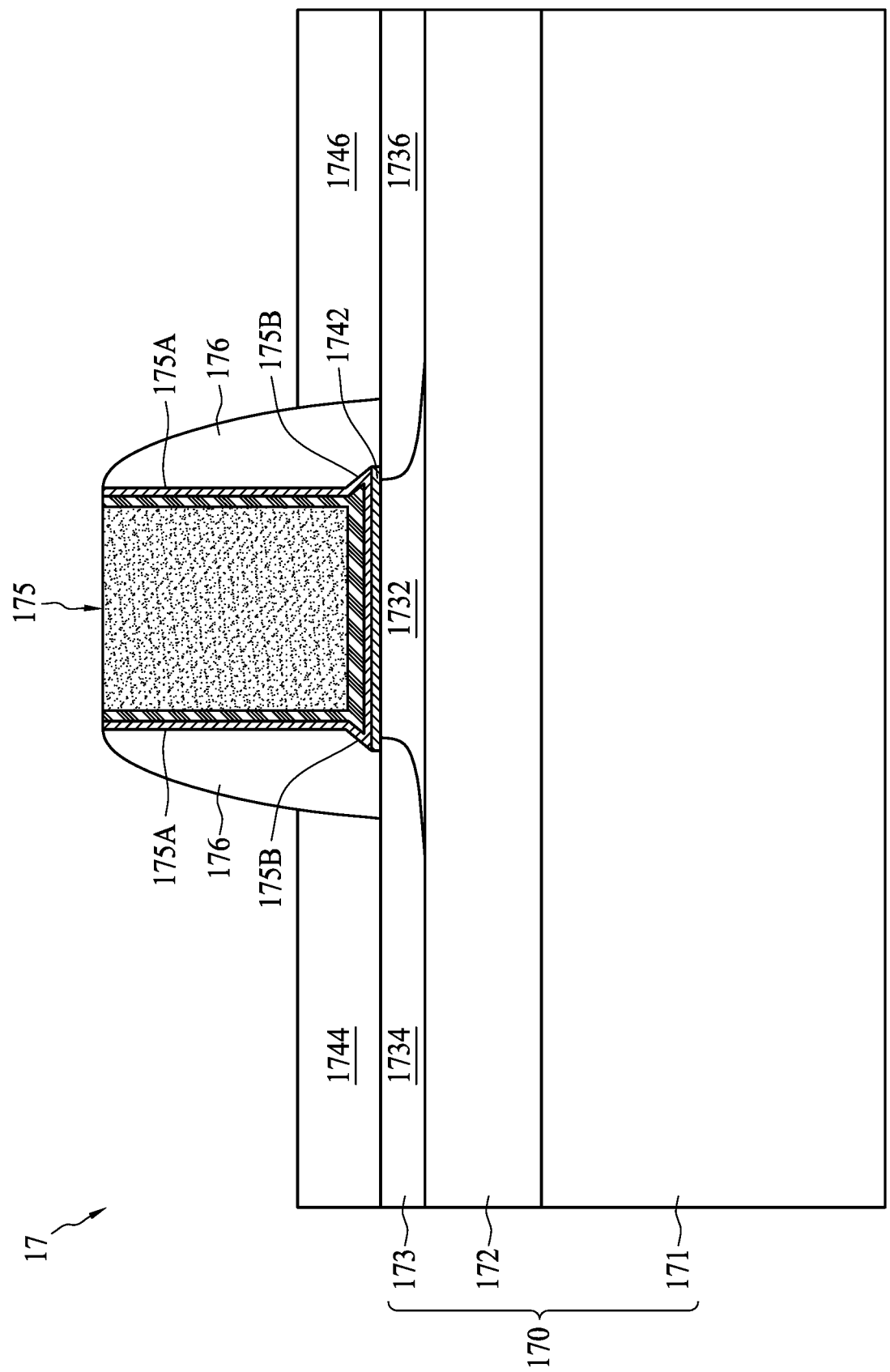
FIG. 17 is a schematic cross-sectional diagram of a UTB SOI FET structure with a gate structure that includes footing regions in accordance with some embodiments.

FIG. 17 is a schematic cross-sectional diagram of an Ultrathin-body (UTB) SOI FET structure 17 with a gate structure 175 that includes footing regions 175B in accordance with some embodiments. FIG. 17 illustrates that the gate structure 140 includes a central region 175A and footing regions 175B formed on opposite sides of the central region 175A and along where the central region 175A is adjacent to the semiconductor structure 173. The semiconductor structure 173 is a semiconductor layer on an insulator layer of an SOI substrate 170. The UTB SOI FET structure 17 includes an SOI substrate 170, a gate structure 175, spacers 176 and raised source and drain regions 1744 and 1746.

In some embodiments, the SOI substrate 170 includes a handle substrate 171, the insulator layer 172, and the semiconductor structure 173. In some embodiments, the handle substrate 171 is a bulk semiconductor substrate such as a bulk silicon substrate. The insulator layer 172 is formed on the handle substrate 171. In some embodiments, the insulator layer 172 is a buried oxide (BOX) layer. The semiconductor structure 173 is formed on the insulator layer 172. In some embodiments, the semiconductor structure 173 has a thickness of about 3 nm to 30 nm. Exemplary materials for the semiconductor structure 173 are similar to those of the fin-like semiconductor structure 120 described with references to FIGS. 1A to 1C and are omitted here. In some embodiments, the SOI substrate 170 is fabricated using separation by implantation of oxygen (SIMOX), wafer bonding, and/or other suitable techniques.

In some embodiments, an interfacial layer 1742 is formed on the top surface of the semiconductor structure 173. Exemplary materials for the interfacial layer 1742 have been provided with references to FIGS. 1A to 1C.

In some embodiments, the gate structure 175 is formed atop the interfacial layer 1742. In some embodiments, the interfacial layer 1742 is etched in alignment with the gate structure 175 formed. In the semiconductor structure 132, a region over which the gate structure 175 is formed is defined as a channel region 1732. The gate structure 175 includes a central region 175A and footing regions formed on opposite sides of the central region 175A and along where the central region 175A is adjacent to the channel region 1732. Compared to the gate structure 140 described with references to FIGS. 1A to 1C, the gate structure 175 are formed above the channel region 1732. In some embodiments, the spacers 176 are formed on opposite sides of the gate structure 175 and have indented portions that abut the footing regions 175B.

In some embodiments, the semiconductor structure 173 includes the channel region 1732, and source and drain regions 1734 and 1736. The source and drain regions 1734 and 1736 are formed on opposite ends of the channel region 1732. Compared to the source and drain regions 1244 and 1264 described with references to FIGS. 1A to 1C, the source and drain regions 1734 and 1736 extend under the spacers 176.

In some embodiments, the UTB SOI FET structure 17 is a MOSFET structure, and the source and drain regions 1724 and 1736 are doped with p-type dopants for forming a PMOS or doped with n-type dopants for forming an NMOS. In some embodiments, because the source and drain regions 1734 and 1736 extend under the spacers 176, the dopants are implanted in a tilted manner. Similar to the embodiments described with references to FIGS. 8A to 8C, both vertical components and lateral components of ion beams are blocked by the footing regions 175B from damaging the interfacial layer 1742.

Further, in some embodiments, raised source and drain regions 1744 and 1746 are formed atop the source and drain regions 1734 and 1736. In some embodiments, the raised source and drain regions 1744 and 1746 are formed using a selective epitaxial deposition process. In some embodiments, the raised source and drain regions 1734 and 1736 are in-situ doped. The material of the raised source and drain regions 1744 and 1746 can be the same as, or different from, the material of the source and drain regions 1734 and 1736.

In some embodiments, the raised source and drain regions 1744 and 1746 are formed of a stressor material that has a different lattice constant from that of the semiconductor structure 173, thereby creating mechanical strain applied to the channel region 1732. Due to the footing regions 175B, a distance between the channel regions 1732 and the raised source and drain regions 1744 and 1746 are decreased. Therefore, the mechanical strain applied to the channel region 1732 is increased.

In the embodiments described with reference to FIG. 17, the UTB SOI FET structure 17 is implemented as a MOSFET. Other types of the FET such as a tunnel FET are within the contemplated scope of the present disclosure.

Some embodiments have one or a combination of the following features and/or advantages. In some embodiments, a FinFET structure has a gate structure that wraps around a channel region, and an interfacial layer between the channel region and the gate structure. In some embodiments, a UTB SOI FET structure has a gate structure atop a channel region, and an interfacial layer between the channel region and the gate structure. For both of the FinFET structure and the UTB SOI FET structure, the gate structure includes a central region that wraps around the channel region, and footing regions formed on opposite sides of the central region and along where the central region is adjacent to the channel region. The footing regions protect the interfacial layer from being damaged during ion implantation so that a more uniform gate dielectric can be formed. Therefore, a within gate work function variation is reduced. Further, stressor regions formed on opposite ends of the channel region have a smaller distance to the channel region because the channel region is expanded by the footing regions. Therefore, carrier mobility in the channel region can be further enhanced due to a larger strain applied to the channel region.

In some embodiments, an FET structure includes a first semiconductor structure and a gate structure. The first semiconductor structure includes a channel region, and a source region and a drain region. The source region and the drain region are formed on opposite ends of the channel region, respectively. The gate structure includes a central region and footing regions. The central region is formed over the first semiconductor structure. The footing regions are formed on opposite sides of the central region and along where the central region is adjacent to the first semiconductor structure.

In some embodiments, in a method, a first semiconductor structure including a channel region is provided. A gate electrode layer over the channel region is formed. The gate electrode layer is etched under one or more pressures for forming an anisotropic central region and redeposited footing regions of a gate electrode. The footing regions are formed on opposite sides of the central region and along where the central region is adjacent to the first semiconductor structure. A source region and a drain region are formed in the first semiconductor structure and on opposite ends of the channel region.

In some embodiments, a semiconductor structure includes a first semiconductor structure and a gate structure. The gate structure includes a central region and footing regions. The central region is formed over the first semiconductor structure. The footing regions are formed on opposite sides of the central region and along where the central region is adjacent to the first semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor (FET) structure, comprising:
a substrate having a surface;
a first semiconductor structure comprising:
    a channel region, and
    a source region and a drain region formed on opposite ends of the channel region, respectively;
a gate electrode comprising:
    a central region formed over the surface and at least wrapping around three sides of the channel region, and footing regions formed on opposite sides of the central region and along where the central region is adjacent to the three sides of the channel region to wrap around the three sides of the channel region; and
an interfacial layer formed between the first semiconductor structure and the gate electrode, wherein the interfacial layer laterally protrudes from each end of the footing regions.

2. The FET structure of claim 1, wherein each footing region is tapered towards the central region from a first end of the footing region to a second end of the footing region, and the first end of the footing region is closer to the first semiconductor structure than the second end of the footing region.

3. The FET structure of claim 1, wherein each of the source region and the drain region comprises or is in contact with a stressor material that has a lattice constant different from that of a material of the channel region.

4. The FET structure of claim 1,
wherein the first semiconductor structure comprises a fin structure.

5. The FET structure of claim 4, further comprising:
a gate spacer formed over a side wall of the gate electrode, wherein the side wall of the gate electrode traverses the first semiconductor structure; and
a fin spacer formed over a side wall of an exposed portion of the first semiconductor structure on a side of the gate electrode,
wherein the gate spacer and the fin spacer form an L-shaped cross-section, the L-shaped cross-section is substantially parallel to the surface of the substrate and the L-shaped cross-section has an indented corner that abuts one of the footing regions.

6. The FET structure of claim 5, further comprising:
a source extension region formed between the channel region and the source region, wherein the source extension region is more lightly doped than the source region; and
a drain extension region formed between the channel region and the drain region, wherein the drain extension region is more lightly doped than the drain region.

7. The FET structure of claim 1, further comprising:
a handle substrate; and
an insulator layer over the handle substrate,
wherein the first semiconductor structure is configured over the insulator layer, and
the gate electrode is formed over the channel region.

8. A semiconductor structure, comprising:
a first semiconductor structure, including a fin structure; and
a gate electrode wrapping around at least three sides of the fin structure, and the gate electrode comprising:
    a central region formed over the first semiconductor structure, and
    footing regions formed on opposite sides of the central region and along where the central region is adjacent to the at least three sides of the fin structure to wrap around the three sides of the fin structure; and
an interfacial layer formed between the first semiconductor structure and the gate electrode, wherein the interfacial layer laterally protrudes from each end of the footing regions.

9. The semiconductor structure of claim 8, wherein each footing region is tapered toward the central region from a first end of the footing region to a second end of the footing region, and the first end of the footing region is closer to the first semiconductor structure than the second end of the footing region.

10. The semiconductor structure of claim 8,
further comprising a gate spacer formed over a side wall of the gate electrode.

11. The semiconductor structure of claim 8, further comprising:
a handle substrate; and
an insulator layer over the handle substrate,
wherein the first semiconductor structure is configured over the insulator layer, and
the gate electrode is formed over a channel region of the first semiconductor structure.

12. The semiconductor structure of claim 8, further comprising:
a gate spacer formed over a side wall of the gate electrode, wherein the side wall of the gate electrode traverses the first semiconductor structure.

13. The semiconductor structure of claim 12, further comprising:
a fin spacer formed over a side wall of an exposed portion of the first semiconductor structure on a side of the gate electrode,
wherein the gate spacer and the fin spacer form an L-shaped cross-section, the L-shaped cross-section is substantially parallel to the surface of the substrate and the L-shaped cross-section has an indented corner that abuts one of the footing regions.

14. A semiconductor structure, comprising:
a first semiconductor structure comprising:
    a channel region, and
    a source region and a drain region formed on opposite ends of the channel region, respectively;
a gate electrode;
    wherein a central region of the gate electrode is formed over the first semiconductor structure, and footing regions of the gate electrode is on opposite sides of the central region and along where the central region is adjacent to the first semiconductor structure;
    wherein each footing region is tapered towards the central region from a first end of the footing region to a second end of the footing region, and the first end of the footing region is closer to the first semiconductor structure than the second end of the footing region; and an interfacial layer formed between the first semiconductor structure and the gate electrode, wherein the interfacial layer laterally protrudes from each end of the footing regions.

15. The semiconductor structure of claim 14, wherein each of the source region and the drain region comprises or is in contact with a stressor material that has a lattice constant different from that of a material of the channel region.

16. The semiconductor structure of claim 14, further comprising:

a substrate that comprises a surface, wherein the first semiconductor structure comprises a fin structure, and the fin structure protrudes from the surface of the substrate; and the gate electrode wraps around at least three sides of the channel region.

17. The semiconductor structure of claim 16, further comprising:

a gate spacer formed over a side wall of the gate electrode, wherein the side wall of the gate electrode traverses the first semiconductor structure; and a fin spacer formed over a side wall of an exposed portion of the first semiconductor structure on a side of the gate electrode, wherein the gate spacer and the fin spacer form an L-shaped cross-section, the L-shaped cross-section is substantially parallel to the surface of the substrate and the L-shaped cross-section has an indented corner that abuts one of the footing regions.

18. The semiconductor structure of claim 17, further comprising:

a source extension region formed between the channel region and the source region, wherein the source extension region is more lightly doped than the source region; and a drain extension region formed between the channel region and the drain region, wherein the drain extension region is more lightly doped than the drain region.

19. The semiconductor structure of claim 14, further comprising:

a handle substrate; and an insulator layer over the handle substrate, wherein the first semiconductor structure is configured over the insulator layer, and the gate electrode is formed over the channel region.

20. The semiconductor structure of claim 14, further comprising:

a source extension region formed between the channel region and the source region, wherein the source extension region is more lightly doped than the source region; and a drain extension region formed between the channel region and the drain region, wherein the drain extension region is more lightly doped than the drain region.

\* \* \* \* \*